(12) United States Patent
Okumura et al.

(10) Patent No.: US 8,470,510 B2
(45) Date of Patent: Jun. 25, 2013

(54) POLYMER FOR LITHOGRAPHIC PURPOSES AND METHOD FOR PRODUCING SAME

(75) Inventors: Arimichi Okumura, Himeji (JP); Keizo Inoue, Himeji (JP); Kazuki Okamoto, Himeji (JP)

(73) Assignee: Daicel Chemical Industries, Ltd., Osaka-Shi (JP)

( * ) Notice: Subject to any disclaimer, the term of this patent is extended or adjusted under 35 U.S.C. 154(b) by 205 days.

(21) Appl. No.: 12/992,423

(22) PCT Filed: Jun. 1, 2009

(86) PCT No.: PCT/JP2009/002437
§ 371 (c)(1),
(2), (4) Date: Nov. 12, 2010

(87) PCT Pub. No.: WO2009/147823
PCT Pub. Date: Dec. 10, 2009

(65) Prior Publication Data
US 2011/0065044 A1    Mar. 17, 2011

(30) Foreign Application Priority Data

Jun. 6, 2008 (JP) ................................ 2008-149979

(51) Int. Cl.
*G03F 7/039* (2006.01)
*G03F 7/20* (2006.01)
*G03F 7/30* (2006.01)
*C08F 265/02* (2006.01)
*C08F 265/06* (2006.01)

(52) U.S. Cl.
USPC ........ 430/270.1; 430/311; 430/326; 430/910; 525/289; 525/312; 525/327.2; 525/328.8; 525/329.7; 525/330.3; 526/328.5; 526/329.6; 526/282; 526/284; 526/280; 526/281

(58) Field of Classification Search
None
See application file for complete search history.

(56) References Cited

U.S. PATENT DOCUMENTS

| | | | | |
|---|---|---|---|---|
| 5,939,235 | A * | 8/1999 | Kondo et al. | 430/270.1 |
| 6,156,477 | A * | 12/2000 | Motomi et al. | 430/270.1 |
| 2007/0111136 | A1 | 5/2007 | Miyasaka et al. | |
| 2007/0190455 | A1 * | 8/2007 | Iwai et al. | 430/270.1 |

FOREIGN PATENT DOCUMENTS

| | | |
|---|---|---|
| JP | 2000-63327 A | 2/2000 |
| JP | 2002-296782 A | 10/2002 |
| JP | 2004-91757 A | 3/2004 |
| JP | 2006-3844 A | 1/2006 |
| JP | 3756270 B2 | 3/2006 |
| WO | WO 2005/022260 A1 | 3/2005 |
| WO | WO 2006/016648 A1 | 2/2006 |

OTHER PUBLICATIONS

Shirai et al ("Chain Propagation in UV Curing of Di(meth)acrylates", Chemistry of Materials, vol. 20 (5), p. 1971-1976 (2008)).*
International Search Report for PCT/JP2009/002437 dated Sep. 8, 2009.

* cited by examiner

*Primary Examiner* — Sin J. Lee
(74) *Attorney, Agent, or Firm* — Birch, Stewart, Kolasch & Birch, LLP

(57) ABSTRACT

A polymer for lithographic purposes has at least a repeating structural unit represented by following General Formula (I). In Formula (I), $R^1$, $R^3$, $R^4$, and $R^6$ each independently represent hydrogen atom, a halogen atom, cyano group, an alkyl group, or a haloalkyl group; $R^2$ and $R^5$ each independently represent hydrogen atom, cyano group, etc.; $X^1$ and $X^2$ each independently represent single bond, or a substituted or unsubstituted bivalent alkylene, alkenylene, or cycloalkylene group, etc.; $X^3$ and $X^4$ each independently represent single bond or —CO—; $R^7$, $R^8$, $R^9$, and $R^{10}$ each independently represent hydrogen atom, an alkyl group, or a cycloalkyl group. The polymer for lithographic purposes shows good balance between line edge roughness (LER) and etching resistance and allows very fine and uniform patterning.

[Chem. 1]

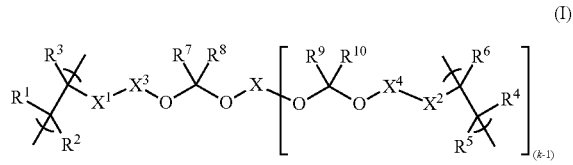

(I)

10 Claims, No Drawings

POLYMER FOR LITHOGRAPHIC PURPOSES AND METHOD FOR PRODUCING SAME

TECHNICAL FIELD

The present invention relates to a polymer for lithographic purposes (resin for photoresists) and a production method thereof, which polymer is used typically in fine patterning (microlithography) of semiconductor devices. The present invention also relates to a composition for lithographic purposes, and a method for manufacturing a semiconductor device using the composition for lithographic purposes.

BACKGROUND ART

Recent dramatic innovation on lithographic patterning techniques in the manufacture of semiconductors (semiconductor devices) has made design rules as line widths finer and finer. Initially, i-line (i-ray) and g-line (g-ray) were used in lithographic exposure and gave patterns with broad line widths, and the manufactured semiconductor devices thereby had low capacities. However, recent technological development has allowed the use of KrF excimer laser and further recently has allowed the use of ArF excimer laser to give patterns in accordance with dramatically finer design rules. In addition, developments for finer and finer design rules in patterning have been still actively made. Typically, exposure systems which allow immersion lithography have been developed; and techniques for irradiation with extreme-ultraviolet rays (EUV) having shorter wavelengths among ultraviolet rays have also been developed. With finer and finer design rules in patterning, requirements of line edge roughness (LER) as an index of surface roughness of patterns become exacting. For improving LER, there have been examined techniques typically of designing a polymer to have a uniform copolymerization composition; of reducing a difference in polarity between or among monomers to thereby suppress the cohesion of molecular chains; and of designing the polymer to have a lower molecular weight to reduce respective units to be dissolved in an alkali developer during development. The technique of designing the polymer to have a lower molecular weight is effective from the viewpoint of reducing LER, but such a polymer having a lower molecular weight suffers from problems such that it develops crystallinity to have insufficient film-forming properties or has a lowered strength to cause pattern collapse. To solve these problems, there has been proposed a technique of cross-linking polymer chains through a compound capable of cleaving typically with an acid. This technique reduces LER probably for the following reason. Specifically, when such a cross-linked polymer is used, the polymer in unexposed portions has a high molecular weight and shows a sufficient strength, whereas the polymer in exposed portions is cleaved at its cross-links by the action of an acid generated through exposure, and the resulting polymer is dissolved as small structural units in an alkaline developer during development. Thus, units dropping off from the exposed portions become smaller to thereby reduce LER.

Japanese Unexamined Patent Application Publication (JP-A) No. 2002-296782 proposes a polymer which is a cross-linked polymer having one acetal structure per its cross-linking chain. This compound (polymer) is insufficiently efficiently cleaved into units of low molecular weights, because the compound has only one point (acetal structure), which is cleavable by the action of an acid, per its cross-linking chain.

Japanese Unexamined Patent Application Publication (JP-A) No. 2006-003844 discloses a cross-linked polymer which is cross-linked through a divinyl ether compound with a hydroxyl group bound to a polycyclic alicyclic hydrocarbon group in a side chain of the polymer. The repulsing compound (polymer) shows a poor efficiency in cross-linking reaction, probably because the polymer uses, as cross-linking points through the divinyl ether, hydroxyl groups bound to a multi-valent alicyclic hydrocarbon, and this causes steric hindrance. In addition, the polymer does not effectively improve LER, because the polymer uses hydroxyl groups as reaction points with the divinyl ether and thereby does not significantly change in solubility in an alkaline developer between before and after cleavage of cross-links.

Japanese Patent No. 3756270 discloses a polymer whose carboxyl groups in polymer side chains are cross-linked through a divinyl ether compound. To have a sufficiently reduced molecular weight in polymer chains after exposure, this compound (polymer) should contain a large amount of carboxyl groups acting as cross-linking points and thereby shows an excessively high sensitivity with respect to an acid. This reduces the maximum allowable limit in variation of the amount of generated acid, which variation is caused typically by fluctuations in exposure, and the polymer has poor handle-ability. As is described above, there has been found no material having LER and etching resistance in good balance, and demands have been made to provide a resist polymer by which the above problems are improved.

CITATION LIST

Patent Literature

PTL 1: Japanese Unexamined Patent Application Publication (JP-A) No. 2002-296782
PTL 2: Japanese Unexamined Patent Application Publication (JP-A) No. 2006-003844
PTL 3: Japanese Patent No. 3756270

SUMMARY OF INVENTION

Technical Problem

To solve the above problems, an attempt has been made to use a polymer containing hydroxyl groups and carboxyl groups in coexistence as reaction points with a divinyl ether, but it has been found that the polymer shows significantly lower etching resistance because of a larger content of oxygen atoms in the polymer, although the polymer is effective to reduce LER. Accordingly, an object of the present invention is to provide a polymer for lithographic purposes (resin for photoresists) and a production method thereof, a composition for lithographic purposes, and a method for manufacturing a semiconductor device using the composition for lithographic purposes, each of which can solve the above problems and allows very fine and uniform patterning in the manufacture of semiconductor devices.

Solution to Problem

After intensive investigations to achieve the above object, the present inventors have found that the use of a polymer cross-linked through acetal bonds each having an aromatic ring allows very fine and uniform patterning. The present invention has been made based on these findings.

Specifically, the present invention provides, in an embodiment, a polymer (A) for lithographic purposes having at least a repeating structural unit represented by following General Formula (I):

[Chem. 1]

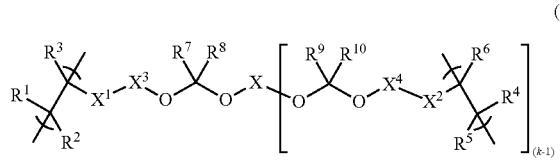

(I)

wherein $R^1$, $R^3$, $R^4$, and $R^6$ each independently represent hydrogen atom, a halogen atom, cyano group, an alkyl group, or a haloalkyl group; $R^2$ and $R^5$ each independently represent hydrogen atom, cyano group, —CO—$OR^A$, or —CON($R^B$)($R^C$); $X^1$ and $X^2$ each independently represent single bond, or a substituted or unsubstituted bivalent alkylene, alkenylene, or cycloalkylene group, or —O—, —$SO_2$—, —O—$COR^D$—, —CO—O—$R^E$—, or —CO—N($R^F$)—$R^G$—; $X^3$ and $X^4$ each independently represent single bond or —CO—; $R^7$, $R^8$, $R^9$, and $R^{10}$ each independently represent hydrogen atom, an alkyl group, or a cycloalkyl group, wherein $R^7$ and $R^8$ may be bound to each other to form a ring with the adjacent carbon atom, and wherein $R^9$ and $R^{10}$ may be bound to each other to form a ring with the adjacent carbon atom; X represents a substituted or unsubstituted group having a valency of "k" and including at least one aromatic cyclic group and at least one nonaromatic group; "k" denotes an integer of 2 or more; $R^A$ represents hydrogen atom, or an alkyl group, a cycloalkyl group, an alkenyl group, or a group decomposable by the action of an acid; $R^B$, $R^C$, and $R^F$ each independently represent hydrogen atom, an alkyl group, a cycloalkyl group, or an alkenyl group, wherein $R^B$ and $R^C$ may be bound to each other to form a ring; and $R^D$, $R^E$, and $R^G$ each independently represent single bond, or a bivalent alkylene, alkenylene, cycloalkylene, or bridged cyclic hydrocarbon (bridged hydrocarbon) group each of which may have at least one of ether group, ester group, amido group, urethane group, and ureido group, or a group containing two or more of these groups bound to each other, and wherein the groups in the parentheses in a number of (k−1) may be the same as or different from each other.

In another embodiment, the present invention provides a polymer (A') for lithographic purposes, as a product from a reaction between a polymeric compound (B) and a compound (C) in the presence of a catalyst, in which the polymeric compound (B) includes at least one repeating structural unit represented by following General Formula (II):

[Chem. 2]

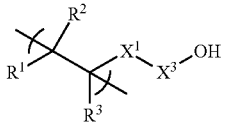

(II)

wherein $R^1$ and $R^3$ each independently represent hydrogen atom, a halogen atom, cyano group, an alkyl group, or a haloalkyl group; $R^2$ represents hydrogen atom, cyano group, —CO—$OR^A$, or —CO—N($R^B$)($R^C$); $X^1$ represents single bond, or a substituted or unsubstituted bivalent alkylene, alkenylene, or cycloalkylene group, or —O—, —$SO_2$—, —O—CO—$R^D$—, —CO—O—$R^E$—, or —CO—N($R^F$)—$R^G$—; $X^3$ represents single bond or —CO—; $R^A$ represents hydrogen atom or an alkyl group, a cycloalkyl group, an alkenyl group, or a group decomposable by the action of an acid; $R^B$, $R^C$, and $R^F$ each independently represent hydrogen atom, an alkyl group, a cycloalkyl group, or an alkenyl group, wherein $R^B$ and $R^C$ may be bound to each other to form a ring; and $R^D$, $R^E$, and $R^G$ each independently represent single bond, or a bivalent alkylene, alkenylene, cycloalkylene, or bridged cyclic hydrocarbon (bridged hydrocarbon) group each of which may have at least one of ether group, ester group, amido group, urethane group, and ureido group, or a group containing two or more of these groups bound to each other, and the compound (C) is represented by following General Formula (III):

[Chem. 3]

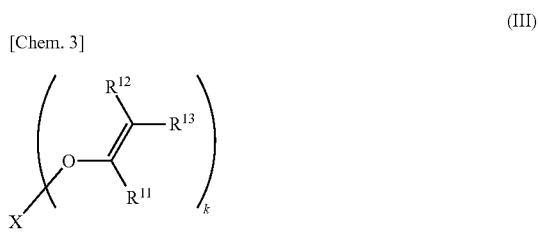

(III)

wherein $R^{11}$ represents hydrogen atom or an alkyl group having 1 to 16 carbon atoms; $R^{12}$ and $R^{13}$ are the same as or different from each other and each represent hydrogen atom, an alkyl group, or a cycloalkyl group, wherein $R^{12}$ and $R^{13}$ may be bound to each other to form a ring with the adjacent carbon atom; X represents a substituted or unsubstituted group having a valency of "k" and including at least one aromatic cyclic group and at least one nonaromatic group; and "k" denotes an integer of 2 or more, wherein the groups in the parentheses in a number of "k" may be the same as or different from each other.

Preferably, the polymeric compound (B) having at least one repeating structural unit represented by General Formula (II) has a weight-average molecular weight of 7000 or less, and the polymer for lithographic purposes has a weight-average molecular weight of 4500 or more, which polymer is obtained from the polymeric compound (B) and the compound (C) represented by General Formula (III) through a reaction between them.

Each of the polymers (A) and (A') for lithographic purposes according to the present invention may further contain at least one of repeating structural units each having a group capable of leaving with an acid to allow the residual moiety to be soluble in an alkali, the repeating structural units represented by following General Formulae (IVa), (IVb), (IVc), (IVd), and (IVe):

[Chem. 4]

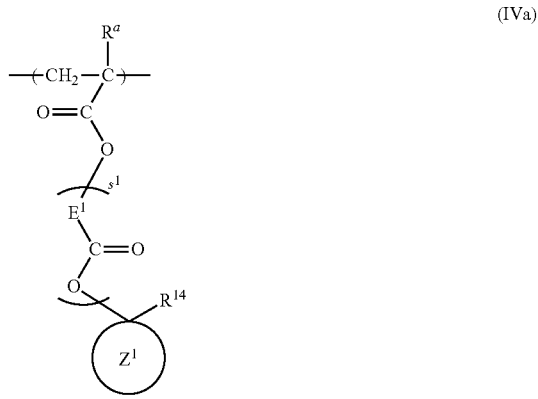

(IVa)

-continued

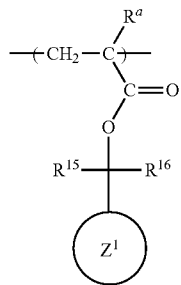

(IVb)

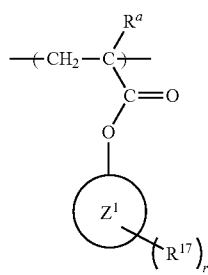

(IVc)

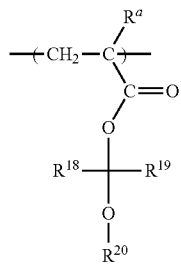

(IVd)

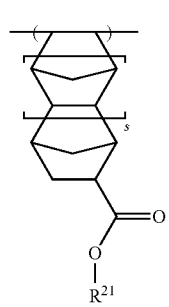

(IVe)

wherein Ring $Z^1$ represents a substituted or unsubstituted alicyclic hydrocarbon ring having 5 to 20 carbon atoms; $R^a$ represents hydrogen atom, a halogen atom, or an alkyl or haloalkyl group having 1 to 14 carbon atoms; $E^1$ represents a bivalent hydrocarbon group having 1 to 12 carbon atoms; "$s^1$" denotes an integer of 0 to 3; $R^{14}$, $R^{15}$, and $R^{16}$ are the same as or different from one another and each represent a substituted or unsubstituted alkyl group having 1 to 6 carbon atoms; $R^{17}$s are substituents bound to Ring $Z^1$, are the same as or different from each other, and each represent oxo group, an alkyl group, a protected or unprotected hydroxyl group, a protected or unprotected hydroxyalkyl group, or a protected or unprotected carboxyl group; "r" is the number of $R^{17}$s and denotes an integer of 1 to 3, wherein at least one of $rR^{17}$s is a —$COOR^i$ group, wherein $R^i$ represents a substituted or unsubstituted tertiary hydrocarbon, tetrahydrofuranyl, tetrahydropyranyl, or oxepanyl group; $R^{18}$ and $R^{19}$ are the same as or different from each other and each represent hydrogen atom or a substituted or unsubstituted alkyl group having 1 to 6 carbon atoms; $R^{20}$ represents hydrogen atom or an organic group, wherein at least two of $R^{18}$, $R^{19}$, and $R^{20}$ may be bound to each other to form a ring with an adjacent atom or atoms, wherein the alicyclic hydrocarbon ring having 5 to 20 carbon atoms as Ring $Z^1$ in Formulae (IVa), (IVb), and (IVc) may be a monocyclic ring or a polycyclic ring such as a fused ring or bridged ring; $R^{21}$ represents t-butyl group, 2-tetrahydrofuranyl group, 2-tetrahydropyranyl group, or 2-oxepanyl group; and "s" denotes 0 or 1.

Each of the polymers (A) and (A') for lithographic purposes according to the present invention can further contain at least one of repeating structural units each having a lactone skeleton and represented by following General Formulae (Va), (Vb), (Vc) (Vd), (Ve), (Vf), (Vg), and (Vh):

[Chem. 5]

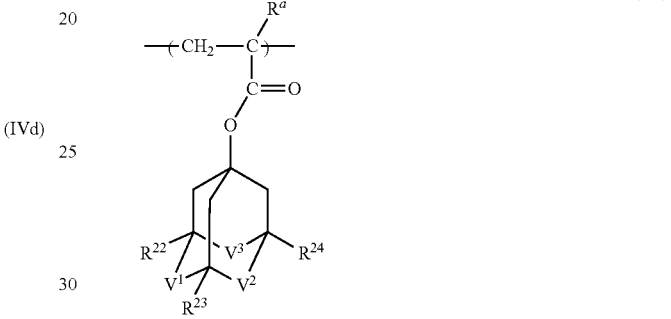

(Va)

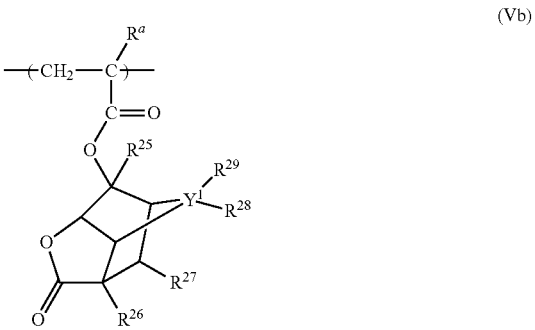

(Vb)

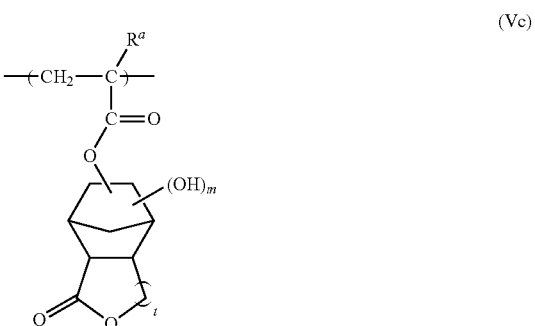

(Vc)

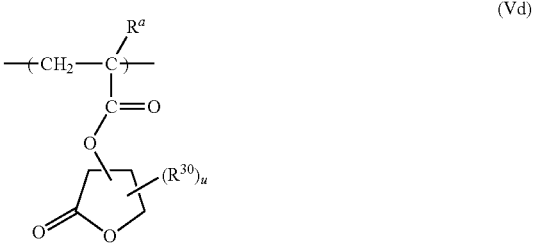

(Vd)

-continued (Ve)
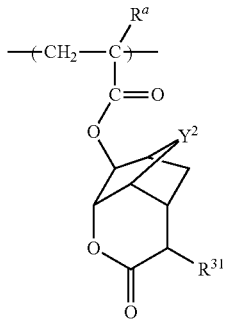

(Vf)
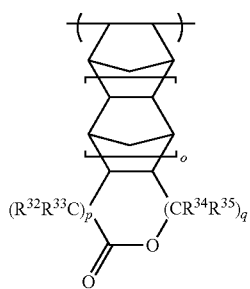

(Vg)
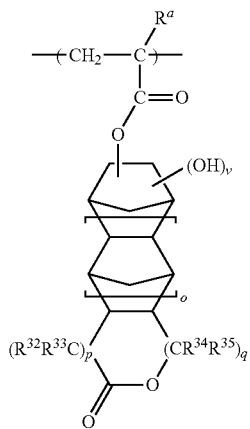

(Vh)
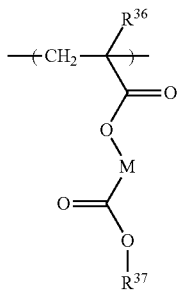

wherein $R^a$ represents hydrogen atom, a halogen atom, or an alkyl or haloalkyl group having 1 to 6 carbon atoms; $R^{22}$, $R^{23}$, and $R^{24}$ are the same as or different from one another and each represent hydrogen atom, an alkyl group, a protected or unprotected hydroxyl group, a protected or unprotected hydroxyalkyl group, or a protected or unprotected carboxyl group; $V^1$, $V^2$, and $V^3$ are the same as or different from one another and each represent —$CH_2$—, —CO—, or —COO—, wherein at least one of $V^1$, $V^2$, and $V^3$ is —COO—; $Y^1$ represents carbon atom, oxygen atom, or sulfur atom, wherein $R^{28}$ and $R^{29}$ are present only when $Y^1$ is carbon atom; $R^{25}$, $R^{26}$, $R^{27}$, $R^{28}$, $R^{29}$, and $R^{30}$ are the same as or different from one another and each represent hydrogen atom, an alkyl group, a protected or unprotected hydroxyl group, a protected or unprotected hydroxyalkyl group, a protected or unprotected carboxyl group, cyano group, a halogen atom, or a fluoroalkyl group having 1 to 6 carbon atoms; "t" denotes an integer of 1 or 2; "u" denotes an integer of 0 or 1; $Y^2$ represents oxygen atom, sulfur atom, or methylene group; $R^{31}$ represents hydrogen atom or an alkyl group having 1 to 6 carbon atoms; $R^{32}$, $R^{33}$, $R^{34}$, and $R^{35}$ are the same as or different from one another and each represent hydrogen atom or methyl group; "o", "p", "q", and "v" each independently denote 0 or 1; $R^{36}$ represents hydrogen atom, a halogen atom, or a substituted or unsubstituted alkyl group having 1 to 6 carbon atoms; $R^{37}$ represents a group having a lactone skeleton; and M represents a bivalent organic group having 1 to 6 carbon atoms.

The polymer (A) for lithographic purposes and polymer (A') for lithographic purposes according to the present invention each preferably contain aromatic cyclic groups in an amount of 1.5 mmol/g or less based on the total weight of the polymer.

The polymer (A) for lithographic purposes and polymer (A') for lithographic purposes according to the present invention each preferably contain a substituted or unsubstituted naphthalene ring as an aromatic ring of X in General Formula (I) or of X in General Formula (III).

The present invention provides, in another embodiment, a composition for lithographic purposes, which contains the polymer (A) for lithographic purposes according to the present invention and/or the polymer (A') for lithographic purposes according to the present invention; and a compound capable of generating an acid upon irradiation with an actinic ray (active ray) or radiation.

In yet another embodiment, the present invention provides a method for manufacturing a semiconductor device. This method includes the steps of applying the composition for lithographic purposes to a base or substrate to form a resist film; and exposing, developing, and thereby patterning the resist film. The exposing is preferably performed using a far-ultraviolet ray having a wavelength of 220 nm or less as an exposing source.

In addition and advantageously, the present invention provides a method for producing a polymer for lithographic purposes. This method includes the step of reacting, in the presence of a catalyst, a polymeric compound (B) with a compound (C), in which the polymeric compound (B) has at least one repeating structural unit represented by following General Formula (II), and the compound (C) is represented by following General Formula (III):

[Chem. 6]

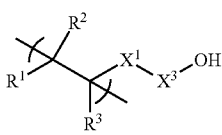

(II)

wherein $R^1$ and $R^3$ each independently represent hydrogen atom, a halogen atom, cyano group, an alkyl group, or a haloalkyl group; $R^2$ represents hydrogen atom, cyano group, —CO—$OR^A$, or —CO—N($R^B$)($R^C$); $X^1$ represents single bond, or a substituted or unsubstituted bivalent alkylene, alkenylene, or cycloalkylene group, or —O—, —$SO_2$—, —O—CO—R$^D$—, —CO—O—R$^E$—, or —CO—N(R$^F$)—R$^G$—; X$^3$ represents single bond or —CO—; R$^A$ represents hydrogen atom or an alkyl group, a cycloalkyl group, an alkenyl group, or a group decomposable by the action of an acid; R$^B$, R$^C$, and R$^F$ each independently represent hydrogen atom, an alkyl group, a cycloalkyl group, or an alkenyl group, wherein R$^B$ and R$^C$ may be bound to each other to form a ring; and R$^D$, R$^E$, and R$^G$ each independently represent single bond, or a bivalent alkylene, alkenylene, cycloalkylene, or bridged cyclic hydrocarbon (bridged hydrocarbon) group each of which may have at least one of ether group, ester group, amido group, urethane group, and ureido group, or a group containing two or more of these groups bound to each other,

[Chem. 7]

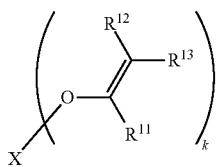

(III)

wherein R$^{11}$ represents hydrogen atom or an alkyl group having 1 to 16 carbon atoms; R$^{12}$ and R$^{13}$ are the same as or different from each other and each represent hydrogen atom, an alkyl group, or a cycloalkyl group, wherein R$^{12}$ and R$^{13}$ may be bound to each other to form a ring with the adjacent carbon atom; X represents a substituted or unsubstituted group having a valency of "k" and including at least one aromatic cyclic group and at least one nonaromatic group; and "k" denotes an integer of 2 or more, wherein the groups in the parentheses in a number of "k" may be the same as or different from each other.

Advantageous Effects of Invention

The polymers for lithographic purposes according to the present invention are cross-linked through acetal bonds each having an aromatic ring, and, when used for lithographic purposes, allow very fine and sharp patterning. They are therefore much advantageously usable in the manufacture typically of semiconductor devices even with high degree of integration, where highly accurate operations are especially required.

DESCRIPTION OF EMBODIMENTS

The polymer (A) for lithographic purposes according to the present invention includes a repeating structural unit represented by General Formula (I).

In General Formula (I), X represents a group having a valency of "k" and containing an aromatic ring as a central skeleton thereof. Of such structures, X preferably has a structure represented by following Formula (1):

[Chem. 8]

(1)

wherein X$^a$ represents an aromatic cyclic group; and X$^b$s each represent a nonaromatic hydrocarbon group which may contain one or more linkage groups, where the terminal (portion indicated by dashed lines in Formula (1)) of the nonaromatic hydrocarbon group is directly bound to oxygen atom that is directly bound to X in Formula (I); "k" denotes an integer of 2 or more, and wherein the groups in the parentheses in a number of "k" may be the same as or different from each other.

X$^b$s each represent, for example, a linear, branched-chain, or cyclic hydrocarbon group or a bridged alicyclic hydrocarbon group, or a group containing one or more groups selected from these hydrocarbon groups in combination with one or more linkage groups selected from ether group, ester group, amido group, urethane group, ureido group, and an aromatic cyclic group.

If X has no aromatic cyclic group X$^a$, the resulting polymer does not have efficiently effectively improved etching resistance and does not efficiently effectively avoid pattern collapse. Exemplary aromatic rings in X$^a$ include benzene ring, naphthalene ring, anthracene ring, phenanthrene ring, pyrene ring, tetracene ring, pentacene ring, chrysene ring, and picene ring. Among them, naphthalene ring and anthracene ring are preferred, of which naphthalene ring is more preferred from the viewpoint of transparency to ArF laser beams.

When X contains no X$^b$ and thereby the aromatic cyclic group X$^a$ is directly bound to oxygen atoms in acetal groups, X$^a$ is preferably an aromatic cyclic group having one or more substituents. Examples of the substituents include halogen atoms; hydrocarbon groups such as alkyl groups, cycloalkyl groups, bicycloalkyl groups, tricycloalkyl groups, and bridged hydrocarbon groups; halogen-substituted hydrocarbon groups; hydrocarbon groups containing a functional group including one or more heteroatoms such as oxygen and sulfur; and groups composed of two or more of these substituents bound to each other. X$^a$ in this case preferably has, as a functional group, a substituent that suppresses the electron-withdrawing properties of the aromatic ring. If X neither contains X$^b$ nor has the substituent, cross-linking reactions may not proceed satisfactorily.

The number "k" should be an integer of 2 or more. If "k" is 1 or less, it is difficult to form bonds (crosslinks) between molecular chains, and this significantly lowers the strength of the pattern. Though not critical as long as being 2 or more, the number "k" is preferably an integer of 2 to 5 and especially preferably 2 or 3, because an excessively large number "k" may cause an excessively high cross-linking density.

In General Formula (I), exemplary halogen atoms as R$^1$, R$^2$, R$^3$, R$^4$, and R$^6$ include fluorine, chlorine, and bromine atoms. Exemplary alkyls as R$^1$, R$^2$, R$^3$, R$^4$, R$^6$, R$^7$, R$^8$, R$^9$, R$^{10}$, and R$^4$ include methyl, ethyl, propyl, isopropyl, butyl, isobutyl, s-butyl, t-butyl, and hexyl groups. Exemplary haloalkyl groups as R$^1$, R$^3$, R$^4$, and R$^6$ include groups corresponding to the alkyl groups, except with at least one hydrogen atom being substituted by fluorine atom, such as monofluoromethyl, difluoromethyl, trifluoromethyl, 2,2,2-trifluoromethyl, tetrafluoroethyl, and 2,2,3,3,3-pentafluoropropyl groups.

Exemplary alkylene groups as X$^1$, X$^2$, R$^D$, R$^E$, and R$^G$ include linear or branched-chain hydrocarbon groups having 1 to 6 carbon atoms, such as methylene, methylmethylene, dimethylmethylene, ethylene, propylene, and trimethylene groups. Exemplary alkenylene groups include vinylene, 1-propenylene, 1,3-butadienylene, and 3-methyl-2-butenylene group. Exemplary cycloalkylene groups include cyclopentenyl group, cyclohexenyl group, cycloheptenyl group, and cyclooctenyl group.

Exemplary groups decomposable by the action of an acid as R$^A$ include substituted or unsubstituted tertiary hydrocarbon groups; and groups that are decomposable by the action of an acid to form carboxyl group, such as tetrahydrofuranyl groups, tetrahydropyranyl groups, and oxepanyl groups.

Exemplary cycloalkyl groups as $R^7$, $R^8$, $R^9$, $R^{10}$, $R^A$, $R^B$, $R^C$, and $R^F$ include cyclopropyl, cyclopentyl, cyclohexyl, cycloheptyl, and cyclooctyl. Exemplary alkenyl groups as $R^B$, $R^C$, and $R^F$ include allyl group. Exemplary bridged cyclic hydrocarbon groups as $R^D$, $R^E$, and $R^G$ include groups containing adamantane ring, norbornane ring, norbornene ring, bornane ring, isobornane ring, tricyclo[5.2.1.0$^{2,6}$]decane ring, and tetracyclo[4.4.0.1$^{2,5}$.1$^{7,10}$]dodecane ring.

The polymer (A) for lithographic purposes according to the present invention has the bridged structure (cross-linked structure) shown in Formula (I) and can thereby give a pattern (patterned film) not only showing less LER (line edge roughness) on its surface but also having improved etching resistance and strength. The repeating structural unit represented by Formula (I) is preferably formed by subjecting a polymeric compound (B) having a repeating structural unit represented by General Formula (II) and a compound (C) represented by General Formula (III) to an addition reaction in the presence of a catalyst, as shown typically in the following reaction scheme:

[Chem. 9]

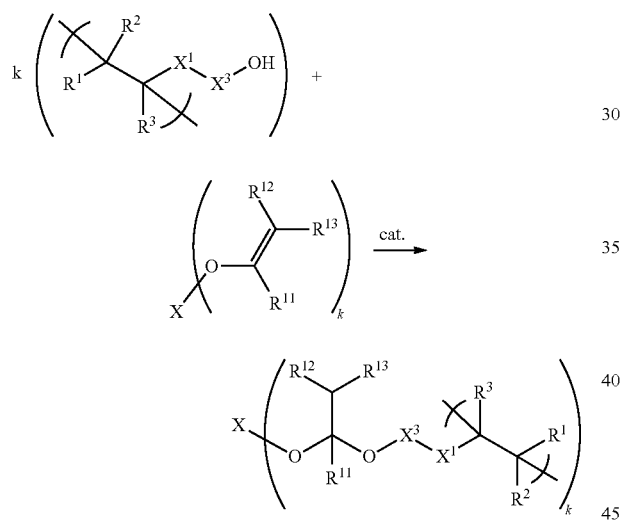

The polymer (A') for lithographic purposes according to the present invention will be illustrated in detail below. It should be noted that the following description relating to the polymer (A') for lithographic purposes will be adopted as intact to the polymer (A) for lithographic purposes, unless otherwise specified.

[Polymeric Compound (B) Having Repeating Structural Unit Represented by General Formula (II)]

The constitutional unit (repeating structural unit) represented by General Formula (II) is a constitutional unit derived, for example, from an α,β-unsaturated carboxylic acid, such as (meth)acrylic acid, or from a mono-(α-lower alkyl)acrylic ester having hydroxyl group or carboxyl group, in which a group is bound to an ester side chain moiety of the (α-lower alkyl)acrylic ester, wherein the group corresponds to the linkage group, except with at least one of hydrogens of the linkage group being substituted by hydroxyl group or carboxyl group.

Examples of the linkage group include single bond; and groups respectively corresponding typically to alkanes, cycloalkanes, bicycloalkanes, tricycloalkane, and tetracycloalkanes, except for one hydrogen atom removed therefrom. More specifically, examples of the groups just mentioned above include groups respectively corresponding to methylene, ethylene, propene, butene, pentene, hexene, heptene, octene, cyclopentane, cyclohexane, cycloheptane, adamantane, norbornane, isobornane, tricyclodecane, tetracyclododecane, and other polycycloalkanes, except for one hydrogen atom removed therefrom. The linkage group may be substituted with or linked through a hydrocarbon group, a halogen atom, a halogen-substituted hydrocarbon group, or a functional group containing a heteroatom such as oxygen or sulfur. The number of hydroxyl group(s) or carboxyl group(s) replacing hydrogen atom(s) of the linkage group is enough to be 1 or more, and the upper limit of the number can be such a number of hydrogen atoms that can be substituted. The number is preferably 1 to 3. It is also acceptable that both hydroxyl group(s) and carboxyl group(s) are substituted on one linkage group.

Specific examples of the repeating structural unit represented by General Formula (II) in the polymeric compound (B) include constitutional units represented by following General Formulae (IIa) to (IIs):

[Chem. 10]

(IIa)

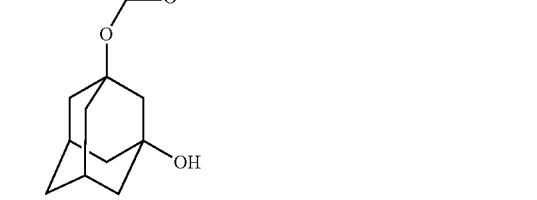
(IIb)

(IIc)

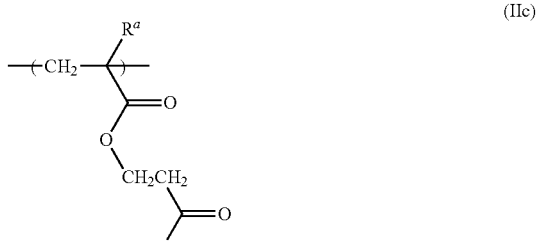
(IId)

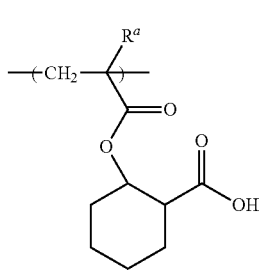

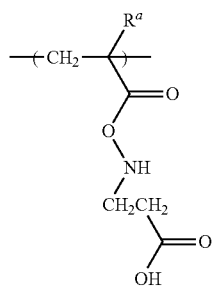 (IIe)
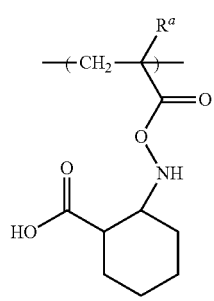 (IIf)
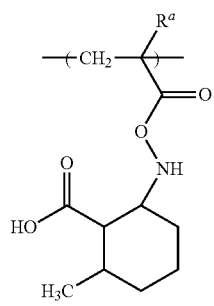 (IIg)
[Chem. 11]
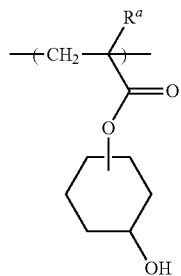 (IIh)
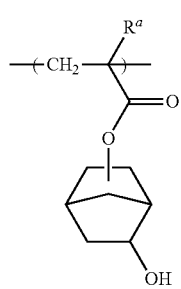 (IIi)
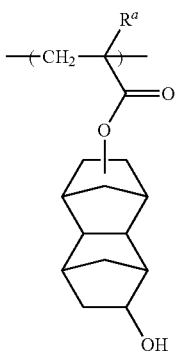 (IIj)
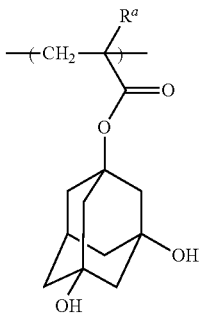 (IIk)
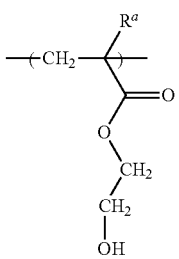 (IIl)
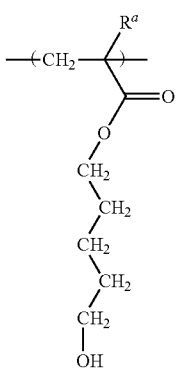 (IIm)
[Chem. 12]
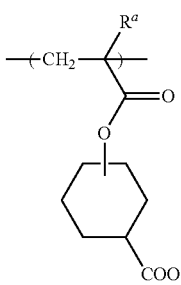 (IIn)

-continued

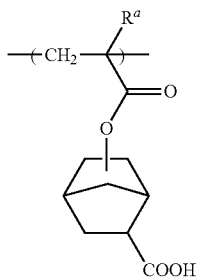
(IIo)

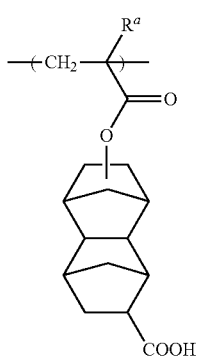
(IIp)

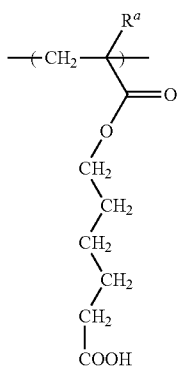
(IIq)

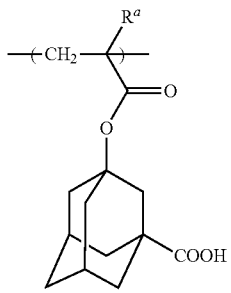
(IIr)

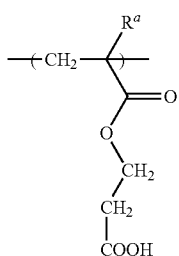
(IIs)

wherein $R^a$ represents hydrogen atom, a halogen atom, or an alkyl or haloalkyl group having 1 to 6 carbon atoms.

In Formulae (IIa) to (IIs), $R^a$ is preferably hydrogen atom or an alkyl group having 1 to 6 carbon atoms and especially preferably hydrogen atom or methyl group.

The polymeric compound (B) may contain only one type of repeating structural unit represented by General Formula (II), but preferably contains two or more different repeating structural units represented by General Formula (II) in combination, and more preferably contains one or more hydroxyl-containing repeating units and one or more carboxyl-containing repeating units in combination. The combination use of one or more hydroxyl-containing repeating units with one or more carboxyl-containing repeating units enlarges the allowable range with respect to variation in light exposure.

The polymeric compound (B) contains repeating structural units represented by General Formula (II) in a content of preferably 5 to 50 percent by mole, based on the moles of the total repeating units in the polymeric compound (B). The polymeric compound (B), if having a content of the specific repeating structural units of less than 5 percent by mole, may not sufficiently undergo a cross-linking reaction and may cause the polymer to show insufficient adhesion typically to a substrate. In contrast, the polymeric compound (B), if having a content of the specific repeating structural units of more than 50 percent by mole, may cause the polymer to have insufficient etching resistance.

[Compound (C) Represented by General Formula (III)]

X in the compound (C) may be the same group as X in the repeating structural units represented by Formula (I). However, in the description relating to X in the repeating structural units represented by Formula (I), the phrase "bound to oxygen atom that is bound to X in Formula (I)" or "bound to oxygen atoms which are in turn bound to X" shall be read as "bound to oxygen atom in vinyl ether group".

Such vinyl ethers can be easily synthetically prepared according to known processes. Among such processes, a process of using a transition metal compound as a catalyst is preferred to prepare vinyl ethers further efficiently. The preparation process using a transition metal compound as a catalyst is described in detail in Japanese Unexamined Patent Application Publication (JP-A) No. 2004-161742.

Specific examples of the compound (C) include, but are not limited to, compounds represented by following Formulae (IIIa) to (IIIp):

[Chem. 13]

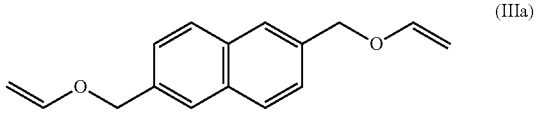
(IIIa)

(IIIb)
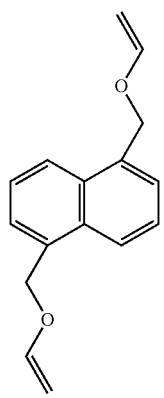
(IIIc)
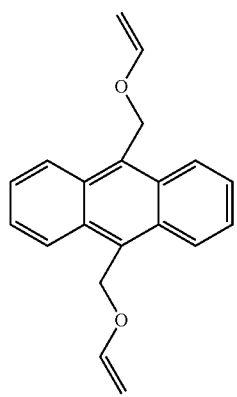
(IIId)
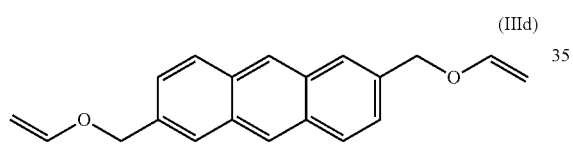
(IIIe)
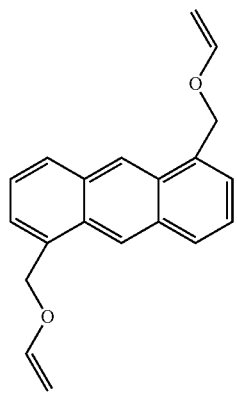
[Chem. 14]
(IIIf)
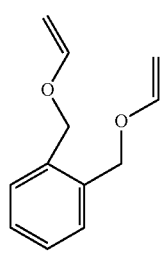
(IIIg)
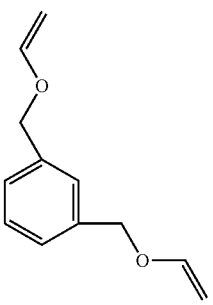
(IIIh)
(IIIi)
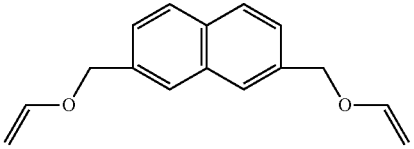
(IIIj)
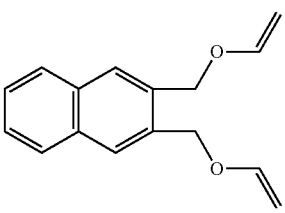
(IIIk)
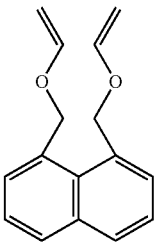
[Chem. 15]
(IIIl)
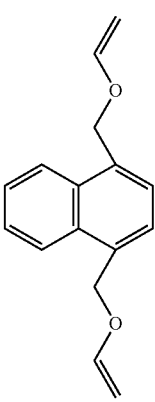

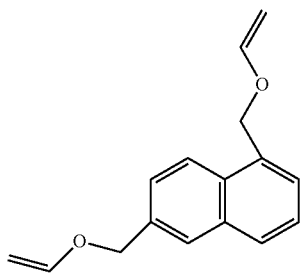
(IIIm)

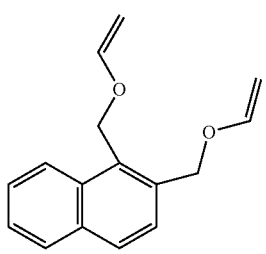
(IIIn)

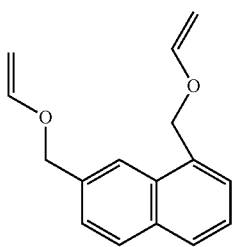
(IIIo)

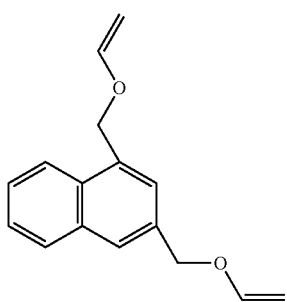
(IIIp)

Of these, the compounds represented by Formulae (IIIa), (IIIb) and (IIIi) to (IIIp) and having a naphthalene skeleton are preferably used, of which the compounds represented by Formulae (IIIa), (IIIb), (IIIi), and (IIIl) are more preferably used, because these compounds efficiently undergo cross-linking reactions to give a polymer showing satisfactory transparency to ArF laser beams and satisfactory etching resistance in good balance.

[Other Repeating Units]

The linear polymeric compound for use in the present invention preferably further contains one or more repeating structural units having a group capable of becoming soluble in an alkali by the action of an acid, in addition to the repeating structural units represented typically by Formulae (I) and (II). The resist resin (polymer), if containing such a repeating structural unit having a group capable of becoming soluble in an alkali, will be more satisfactorily dissolved in an alkali by the action of an acid to allow further sharp patterning. In addition, the polymer in exposed portions can have controlled solubility in an alkali, and this allows a broader range of molecular design regarding typically to the molecular weight and the number of cross-linking points of the polymer. Exemplary monomers corresponding to repeating structural units having a group capable of becoming soluble in an alkali are represented typically by following Formulae (IVa) to (IVe):

[Chem. 16]

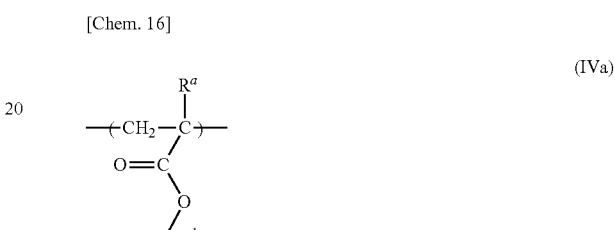
(IVa)

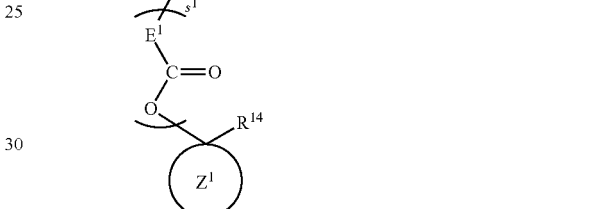
(IVb)

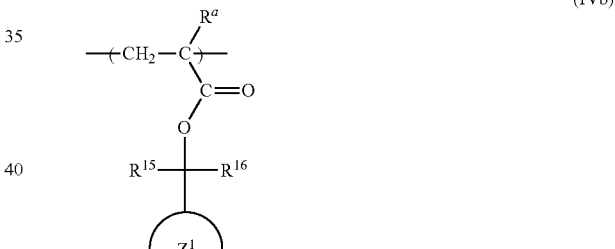
(IVc)

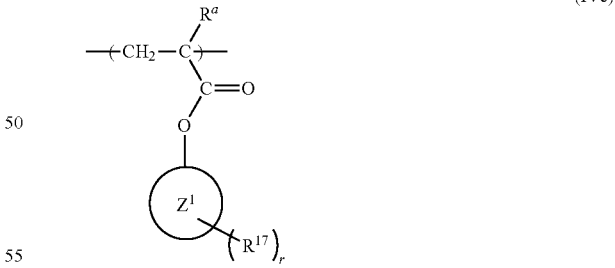
(IVd)

-continued

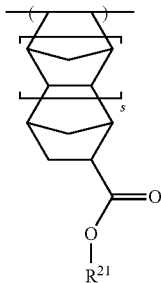

(IVe)

wherein Ring $Z^1$ represents a substituted or unsubstituted alicyclic hydrocarbon ring having 5 to 20 carbon atoms; $R^a$ represents hydrogen atom, a halogen atom, or an alkyl or haloalkyl group having 1 to 14 carbon atoms; $E^1$ represents a bivalent hydrocarbon group having 1 to 12 carbon atoms; "$s^1$" denotes an integer of 0 to 3; $R^{14}$, $R^{15}$, and $R^{16}$ are the same as or different from one another and each represent a substituted or unsubstituted alkyl group having 1 to 6 carbon atoms; $R^{17}$s are substituents bound to Ring $Z^1$, are the same as or different from each other, and each represent oxo group, an alkyl group, a protected or unprotected hydroxyl group, a protected or unprotected hydroxyalkyl group, or a protected or unprotected carboxyl group; "r" is the number of $R^{17}$s and denotes an integer of 1 to 3, wherein at least one of r$R^{17}$s is a —COOR$^i$ group, wherein $R^i$ represents a substituted or unsubstituted tertiary hydrocarbon, tetrahydrofuranyl, tetrahydropyranyl, or oxepanyl group; $R^{18}$ and $R^{19}$ are the same as or different from each other and each represent hydrogen atom or a substituted or unsubstituted alkyl group having 1 to 6 carbon atoms; $R^{20}$ represents hydrogen atom or an organic group, wherein at least two of $R^{18}$, $R^{19}$, and $R^{20}$ may be bound to each other to form a ring with an adjacent atom or atoms, wherein the alicyclic hydrocarbon ring having 5 to 20 carbon atoms as Ring $Z^1$ in Formulae (IVa), (IVb), and (IVc) may be a monocyclic ring or a polycyclic ring such as a fused ring or bridged ring; $R^{21}$ represents t-butyl group, 2-tetrahydrofuranyl group, 2-tetrahydropyranyl group, or 2-oxepanyl group; and "s" denotes 0 or 1.

As $R^a$, exemplary halogen atoms include fluorine, chlorine, and bromine atoms. Exemplary alkyl groups having 1 to 6 carbon atoms include methyl, ethyl, propyl, isopropyl, butyl, isobutyl, s-butyl, t-butyl, and hexyl groups. Exemplary haloalkyl groups having 1 to 6 carbon atoms include groups corresponding to the alkyl groups having 1 to 6 carbon atoms, except with at least one hydrogen atom thereof being substituted by fluorine atom, such as monofluoromethyl, difluoromethyl, trifluoromethyl, 2,2,2-trifluoroethyl, tetrafluoroethyl, and 2,2,3,3,3-tetrafluoropropyl group. $R^a$ is preferably hydrogen atom or an alkyl group having 1 to 6 carbon atoms, of which hydrogen atom or methyl group is especially preferred as $R^a$.

Exemplary substituted or unsubstituted alkyl groups having 1 to 6 carbon atoms as $R^{14}$, $R^{15}$, $R^{16}$, $R^{18}$, and $R^{19}$ include linear or branched-chain alkyl groups having 1 to 6 carbon atoms, such as methyl, ethyl, propyl, isopropyl, butyl, isobutyl, s-butyl, t-butyl, and hexyl groups; and haloalkyl groups having 1 to 6 carbon atoms, such as trifluoromethyl group. In Formula (IVc), exemplary alkyl groups as $R^{17}$s include linear or branched-chain alkyl groups having about 1 to about 20 carbon atoms, such as methyl, ethyl, propyl, isopropyl, butyl, isobutyl, s-butyl, t-butyl, hexyl, octyl, decyl, and dodecyl groups. Exemplary protected or unprotected hydroxyl groups as $R^{17}$s include hydroxyl group; and substituted oxy groups including alkoxy groups having 1 to 4 carbon atoms, such as methoxy, ethoxy, and propoxy groups. Exemplary protected or unprotected hydroxyalkyl groups include groups each composed of an alkylene group having 1 to 6 carbon atoms bound to any of the protected or unprotected hydroxyl groups. In $R^{17}$s, exemplary tertiary hydrocarbon groups as $R^i$ in —COOR$^i$ include t-butyl, t-amyl, 2-methyl-2-adamantyl, and (1-methyl-1-adamantyl)ethyl groups. Exemplary tetrahydrofuranyl groups include 2-tetrahydrofuranyl group; exemplary tetrahydropyranyl groups include 2-tetrahydropyranyl group; and exemplary oxepanyl groups include 2-oxepanyl group.

The alicyclic hydrocarbon ring having 5 to 20 carbon atoms may be a monocyclic ring or a polycyclic ring such as a fused ring or bridged ring. Typical examples of such alicyclic hydrocarbon rings include cyclohexane ring, cyclooctane ring, cyclodecane ring, adamantane ring, norbornane ring, norbornene ring, bornane ring, isobornane ring, perhydroindene ring, decahydronaphthalene ring, perhydrofluorene ring (tricyclo[7.4.0.0$^{3,8}$]tridecane ring), perhydroanthracene ring, tricyclo[5.2.1.0$^{2,6}$]decane ring, tricyclo[4.2.2.1$^{2,5}$]undecane ring, and tetracyclo[4.4.0.1$^{2,5}$.1$^{7,10}$]dodecane ring. The alicyclic hydrocarbon ring may be substituted with one or more substituents including methyl group and other alkyl groups (e.g., alkyl groups having 1 to 4 carbon atoms); chlorine atom and other halogen atoms; protected or unprotected hydroxyl groups; oxo group; and protected or unprotected carboxyl groups. Ring $Z^1$ is preferably a polycyclic alicyclic hydrocarbon ring (bridged hydrocarbon ring) such as adamantane ring.

Exemplary organic groups as $R^{20}$ include groups containing a hydrocarbon group and/or a heterocyclic group. Examples of the hydrocarbon group include aliphatic hydrocarbon groups, alicyclic hydrocarbon groups, aromatic hydrocarbon groups, and groups containing two or more of these bound to each other. Exemplary aliphatic hydrocarbon groups include methyl, ethyl, propyl, isopropyl, butyl, isobutyl, s-butyl, t-butyl, hexyl, octyl, and other linear or branched-chain alkyl groups, of which alkyl groups having 1 to 8 carbon atoms are preferred; allyl group and other linear or branched-chain alkenyl groups, of which alkenyl groups having 2 to 8 carbon atoms are preferred; and propynyl group and other linear or branched-chain alkynyl groups, of which alkynyl groups having 2 to 8 carbon atoms are preferred. Exemplary alicyclic hydrocarbon groups include cyclopropyl, cyclopentyl, cyclohexyl, and other cycloalkyl groups, of which cycloalkyl groups having 3 to 8 members are preferred; cyclopentenyl, cyclohexenyl, and other cycloalkenyl groups, of which cycloalkenyl groups having 3 to 8 members are preferred; and adamantyl, norbornyl, and other bridged carbocyclic groups, of which bridged carbocyclic groups having 4 to 20 carbon atoms are preferred. Exemplary aromatic hydrocarbon groups include aromatic hydrocarbon groups having 6 to 14 carbon atoms, such as phenyl and naphthyl groups. Exemplary groups composed of an aliphatic hydrocarbon group and an aromatic hydrocarbon group bound to each other include benzyl and 2-phenylethyl groups. Each of these hydrocarbon groups may have one or more substituents such as alkyl groups (e.g., alkyl groups having 1 to 4 carbon atoms), haloalkyl groups (e.g., haloalkyl groups having 1 to 4 carbon atoms), halogen atoms, protected or unprotected hydroxyl groups, protected or unprotected hydroxymethyl groups, protected or unprotected carboxyl groups, and oxo group. Protecting groups customarily used in organic syntheses can be used as protecting groups herein.

Of organic groups, preferred are alkyl groups having 1 to 8 carbon atoms, and organic groups containing a cyclic skeleton. Examples of a "ring" constituting the cyclic skeleton include monocyclic or polycyclic nonaromatic or aromatic carbocyclic rings or heterocyclic rings. Of these, especially preferred are monocyclic or polycyclic nonaromatic carbocyclic rings, and lactone rings (to which a nonaromatic carbocyclic ring may be fused). Exemplary monocyclic nonaromatic carbocyclic rings include cycloalkane rings having about 3 to about 15 members, such as cyclopentane ring and cyclohexane ring.

There can be stereoisomers in each of the compounds represented by Formulae (IVa) to (IVd), and each of different stereoisomers can be used alone or in combination as a mixture.

[Monomeric Units of Formula (IVa)]

Typical examples of compounds represented by Formula (IVa) include, but are not limited to, 2-(meth)acryloyloxy-2-methyladamantane, 1-hydroxy-2-(meth)acryloyloxy-2-methyladamantane, 5-hydroxy-2-(meth)acryloyloxy-2-methyladamantane, and 2-(meth)acryloyloxy-2-ethyladamantane.

[Monomeric Units of Formula (IVb)]

Typical examples of compounds represented by Formula (IVb) include, but are not limited to, 1-(1-(meth)acryloyloxy-1-methylethyl)adamantane, 1-hydroxy-3-(1-(meth)acryloyloxy-1-methylethyl)adamantane, 1-(1-ethyl-1-(meth)acryloyloxypropyl)adamantane, and 1-(1-(meth)acryloyloxy-1-methylpropyl)adamantane.

[Monomeric Units of Formula (IVc)]

Typical examples of monomers corresponding to monomeric units represented by Formula (IVc) include, but are not limited to, 1-t-butoxycarbonyl-3-(meth)acryloyloxyadamantane, 1-(2-tetrahydropyranyloxycarbonyl)-3-(meth)acryloyloxyadamantane.

[Monomeric Units of Formula (IVd)]

Typical examples of monomers corresponding to monomeric units represented by Formula (IVd) include, but are not limited to, 1-adamantyloxy-1-ethyl (meth)acrylate, 1-adamantylmethyloxy-1-ethyl (meth)acrylate, 2-(1-adamantylethyl)oxy-1-ethyl (meth)acrylate, 1-bornyloxy-1-ethyl (meth)acrylate, 2-norbornyloxy-1-ethyl (meth)acrylate, 2-tetrahydropyranyl (meth)acrylate, and 2-tetrahydrofuranyl (meth)acrylate.

A compound represented by Formula (IVd) can be obtained typically by reacting a corresponding vinyl ether compound with (meth)acrylic acid according to a customary process using an acid catalyst. Typically, 1-adamantyloxy-1-ethyl (meth)acrylate can be prepared by reacting 1-adamantyl vinyl ether with (meth)acrylic acid in the presence of an acid catalyst.

Typical examples of monomers corresponding to monomeric units represented by Formula (IVe) include, but are not limited to, 5-t-butoxycarbonylnorbornene, 9-t-butoxycarbonyltetracyclo[6.2.1$^{3,6}$.0$^{2,7}$]dodec-4-ene, 5-(2-tetrahydropyranyloxycarbonyl)norbornene, and 9-(2-tetrahydropyranyloxycarbonyl)tetracyclo[6.2.1.1$^{3,6}$.0$^{2,7}$]dodec-4-ene.

The polymers for lithographic purposes according to the present invention preferably further include one or more repeating structural units having a lactone skeleton, in addition to the above-mentioned repeating structural units typically of General Formulae (II) and (III). The polymers, when having one or more repeating structural units having a lactone skeleton, are usable as resist resins having more satisfactory adhesion to a substrate and allow further sharper patterning. Monomers corresponding to such repeating structural units having a lactone skeleton are represented by following Formulae (Va) to (Vh):

[Chem. 17]

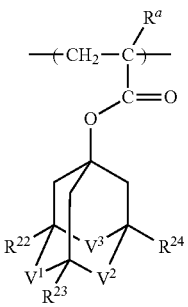
(Va)

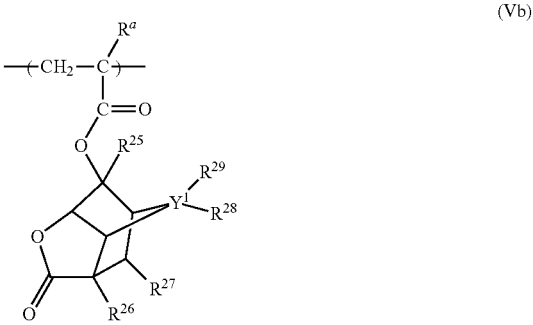
(Vb)

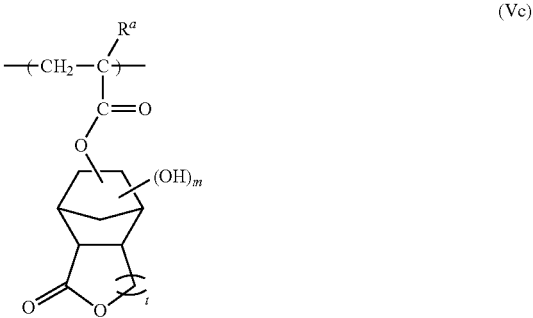
(Vc)

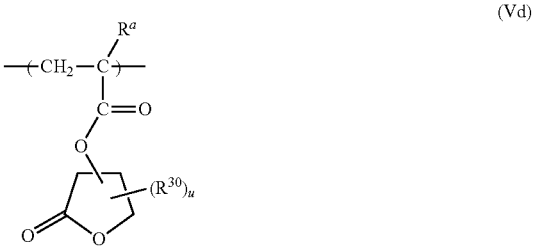
(Vd)

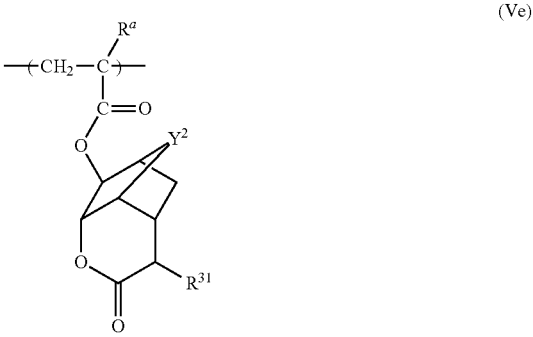
(Ve)

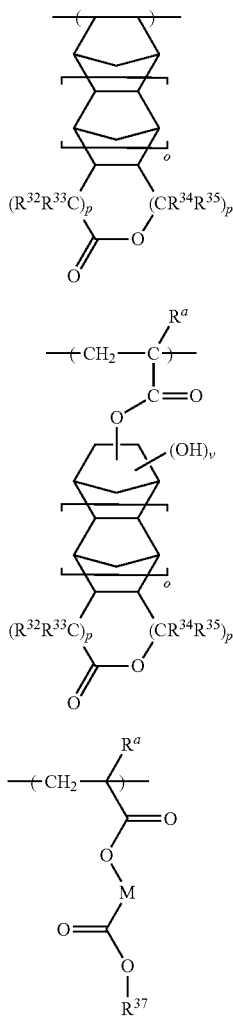

wherein $R^a$ represents hydrogen atom, a halogen atom, or an alkyl or haloalkyl group having 1 to 6 carbon atoms; $R^{22}$, $R^{23}$, and $R^{24}$ are the same as or different from one another and each represent hydrogen atom, an alkyl group, a protected or unprotected hydroxyl group, a protected or unprotected hydroxyalkyl group, or a protected or unprotected carboxyl group; $V^1$, $V^2$, and $V^3$ are the same as or different from one another and each represent —$CH_2$—, —CO—, or —COO—, wherein at least one of $V^1$, $V^2$, and $V^3$ is —COO—; $Y^1$ represents carbon atom, oxygen atom, or sulfur atom, wherein $R^{28}$ and $R^{29}$ are present only when $Y^1$ is carbon atom; $R^{25}$, $R^{26}$, $R^{27}$, $R^{28}$, $R^{29}$, and $R^{30}$ are the same as or different from one another and each represent hydrogen atom, an alkyl group, a protected or unprotected hydroxyl group, a protected or unprotected hydroxyalkyl group, a protected or unprotected carboxyl group, cyano group, a halogen atom, or a fluoroalkyl group having 1 to 6 carbon atoms; "t" denotes an integer of 1 or 2; "u" denotes an integer of 0 or 1; $Y^2$ represents oxygen atom, sulfur atom, or methylene group; $R^{31}$ represents hydrogen atom or an alkyl group having 1 to 6 carbon atoms; $R^{32}$, $R^{33}$, $R^{34}$, and $R^{35}$ are the same as or different from one another and each represent hydrogen atom or methyl group; "o", "p", "q", and "v" each independently denote 0 or 1; $R^{36}$ represents hydrogen atom, a halogen atom, or a substituted or unsubstituted bivalent organic group having 1 to 6 carbon atoms; $R^{37}$ represents a group having a lactone skeleton; and M represents a bivalent organic group having 1 to 6 carbon atoms.

As $R^a$, exemplary halogen atoms include fluorine, chlorine, and bromine atoms. Exemplary alkyl groups having 1 to 6 carbon atoms include methyl, ethyl, propyl, isopropyl, butyl, isobutyl, s-butyl, t-butyl, and hexyl groups. Exemplary haloalkyl groups having 1 to 6 carbon atoms include groups corresponding to the alkyl groups having 1 to 6 carbon atoms, except with at least one hydrogen atom thereof substituted by fluorine atom, such as monofluoromethyl, difluoromethyl, trifluoromethyl, 2,2,2-trifluoroethyl, tetrafluoroethyl, and 2,2,3,3,3-tetrafluoropropyl groups. Among them, hydrogen atom or an alkyl group having 1 to 6 carbon atoms is preferred as $R^a$, of which hydrogen atom or methyl group is more preferred.

The alkyl groups as $R^{22}$, $R^{23}$, $R^{24}$, $R^{25}$, $R^{26}$, $R^{27}$, $R^{28}$, $R^{29}$, and $R^{30}$ are as with the alkyl groups as $R^a$. Exemplary halogen atoms as $R^{25}$, $R^{26}$, $R^{27}$, $R^{28}$, $R^{29}$, and $R^{30}$ include fluorine, chlorine, and bromine atoms. Protecting groups for use herein can be protecting groups customarily used in organic syntheses.

[Monomeric Units of Formula (Va)]

Typical examples of monomers corresponding to (used for the formation of) monomeric units represented by Formula (Va) include, but are not limited to, 1-(meth)acryloyloxy-4-oxatricyclo[4.3.1.1$^{3,8}$]undecan-5-one, 1-(meth)acryloyloxy-4,7-dioxatricyclo[4.4.1.1$^{3,9}$]dodecane-5,8-dione, 1-(meth)acryloyloxy-4,8-dioxatricyclo[4.4.1.1$^{3,9}$]dodecane-5,7-dione, 1-(meth)acryloyloxy-5,7-dioxatricyclo[4.4.1.1$^{3,9}$]dodecane-4,8-dione, 1-(meth)acryloyloxy-3-hydroxyadamantane, 1-(meth)acryloyloxy-3,5-dihydroxyadamantane, 1-(meth)acryloyloxy-3,5,7-trihydroxyadamantane, 1-(meth)acryloyloxy-3-hydroxy-5,7-dimethyladamantane, and 1-(meth)acryloyloxy-3-carboxyadamantane.

[Monomeric Units of Formula (Vb)]

Typical examples of monomers corresponding to monomeric units represented by Formula (Vb) include, but are not limited to, the following compounds. For example, when $Y^1$ is carbon atom, the typical examples include 5-(meth)acryloyloxy-3-oxatricyclo[4.2.1.0$^{4,8}$]nonan-2-one, 5-(meth)acryloyloxy-5-methyl-3-oxatricyclo[4.2.1.0$^{4,8}$]nonan-2-one, 5-(meth)acryloyloxy-1-methyl-3-oxatricyclo[4.2.1.0$^{4,8}$]nonan-2-one, 5-(meth)acryloyloxy-9-methyl-3-oxatricyclo[4.2.1.0$^{4,8}$]nonan-2-one, 5-(meth)acryloyloxy-9-carboxy-3-oxatricyclo[4.2.1.0$^{4,8}$]nonan-2-one, 5-(meth)acryloyloxy-9-methoxycarbonyl-3-oxatricyclo[4.2.1.0$^{4,8}$]nonan-2-one, 5-(meth)acryloyloxy-9-ethoxycarbonyl-3-oxatricyclo[4.2.1.0$^{4,8}$]nonan-2-one, and 5-(meth)acryloyloxy-9-t-butoxycarbonyl-3-oxatricyclo[4.2.1.0$^{4,8}$]nonan-2-one.

The typical examples further include 1-cyano-5-(meth)acryloyloxy-3-oxatricyclo[4.2.1.0$^{4,8}$]nonan-2-one, 1-fluoro-5-(meth)acryloyloxy-3-oxatricyclo[4.2.1.0$^{4,8}$]nonan-2-one, 1-chloro-5-(meth)acryloyloxy-3-oxatricyclo[4.2.1.0$^{4,8}$]nonan-2-one, 1-chloro-5-(meth)acryloyloxy-3-oxatricyclo[4.2.1.0$^{4,8}$]nonan-2-one, 1-trifluoromethyl-5-(meth)acryloyloxy-3-oxatricyclo[4.2.1.0$^{4,8}$]nonan-2-one, 9-cyano-5-(meth)acryloyloxy-3-oxatricyclo[4.2.1.0$^{4,8}$]nonan-2-one, 9-fluoro-5-(meth)acryloyloxy-3-oxatricyclo[4.2.1.0$^{4,8}$]nonan-2-one, 9-chloro-5-(meth)acryloyloxy-3-oxatricyclo[4.2.1.0$^{4,8}$]nonan-2-one, 9-chloro-5-(meth)acryloyloxy-3-oxatricyclo[4.2.1.0$^{4,8}$]nonan-2-one, and 9-trifluoromethyl-5-(meth)acryloyloxy-3-oxatricyclo[4.2.1.0$^{4,8}$]nonan-2-one.

When $Y^1$ is oxygen atom, the typical examples include 1-cyano-5-(meth)acryloyloxy-3,7-dioxatricyclo[4.2.1.0$^{4,8}$]nonan-2-one, 1-fluoro-5-(meth)acryloyloxy-3,7-dioxatricyclo[4.2.1.0$^{4,8}$]nonan-2-one, 1-chloro-5-(meth)acryloyloxy-3,7-dioxatricyclo[4.2.1.0$^{4,8}$]nonan-2-one, 1-chloro-5-(meth)acryloyloxy-3,7-dioxatricyclo[4.2.1.0$^{4,8}$]nonan-2-one, 1-trifluoromethyl-5-(meth)acryloyloxy-3,7-dioxatricyclo[4.2.1.0$^{4,8}$]nonan-2-one, 9-cyano-5-(meth)acryloyloxy-3,7-dioxatricyclo[4.2.1.0$^{4,8}$]nonan-2-one, 9-fluoro-5-(meth)acryloyloxy-3,7-dioxatricyclo[4.2.1.0$^{4,8}$]nonan-2-one, 9-chloro-5-(meth)acryloyloxy-3,7-dioxatricyclo[4.2.1.0$^{4,8}$]nonan-2-one, 9-chloro-5-(meth)acryloyloxy-3,7-dioxatricyclo[4.2.1.0$^{4,8}$]nonan-2-one, and 9-trifluoromethyl-5-(meth)acryloyloxy-3,7-dioxatricyclo[4.2.1.0$^{4,8}$]nonan-2-one.

[Monomeric Units of Formula (Vc)]

Typical examples of monomers corresponding to monomeric units represented by Formula (Vc) include, but are not limited to, 8-(meth)acryloyloxy-4-oxatricyclo[5.2.1.0$^{2,6}$]decan-5-one and 9-(meth)acryloyloxy-4-oxatricyclo[5.2.1.0$^{2,6}$]decan-5-one.

[Monomeric Units of Formula (Vd)]

Typical examples of compounds represented by Formula (Vd) include, but are not limited to, α-(meth)acryloyloxy-γ-butyrolactones such as α-(meth)acryloyloxy-γ-butyrolactone, α-(meth)acryloyloxy-α-methyl-γ-butyrolactone, α-(meth)acryloyloxy-β,β-dimethyl-γ-butyrolactone, α-(meth)acryloyloxy-α,β,β-trimethyl-γ-butyrolactone, α-(meth)acryloyloxy-γ,γ-dimethyl-γ-butyrolactone, α-(meth)acryloyloxy-α,γ,γ-trimethyl-γ-butyrolactone, α-(meth)acryloyloxy-β,β,γ,γ-tetramethyl-γ-butyrolactone, α-(meth)acryloyloxy-α,β,β,γ,γ-pentamethyl-γ-butyrolactone, α-(meth)acryloyloxy-γ-butyrolactone, α-(meth)acryloyloxy-α-methyl-γ-butyrolactone, α-(meth)acryloyloxy-β,β-dimethyl-γ-butyrolactone, α-(meth)acryloyloxy-α,β,β-trimethyl-γ-butyrolactone, α-(meth)acryloyloxy-γ,γ-dimethyl-γ-butyrolactone, α-(meth)acryloyloxy-α,γ,γ-trimethyl-γ-butyrolactone, α-(meth)acryloyloxy-β,β,γ,γ-tetramethyl-γ-butyrolactone, and α-(meth)acryloyloxy-α,β,β,γ,γ-pentamethyl-γ-butyrolactone; and β-(meth)acryloyloxy-γ-butyrolactones such as β-(meth)acryloyloxy-γ-butyrolactone and β-(meth)acryloyloxy-γ-butyrolactone.

[Monomeric Units of Formula (Ve)]

Typical examples of monomers corresponding to monomeric units represented by Formula (Ve) include, but are not limited to, 5-(meth)acryloyloxy-4-oxatricyclo[5.2.1.0$^{5,9}$]decan-3-one, 2-methyl-5-(meth)acryloyloxy-4-oxatricyclo[5.2.1.0$^{5,9}$]decan-3-one, 2-ethyl-5-(meth)acryloyloxy-4-oxatricyclo[5.2.1.0$^{5,9}$]decan-3-one, 5-(meth)acryloyloxy-4,8-dioxatricyclo[5.2.1.0$^{5,9}$]decan-3-one, 2-methyl-5-(meth)acryloyloxy-4,8-dioxatricyclo[5.2.1.0$^{5,9}$]decan-3-one, and 2-ethyl-5-(meth)acryloyloxy-4,8-dioxatricyclo[5.2.1.0$^{5,9}$]decan-3-one.

[Monomeric Units of Formula (Vf)]

Typical examples of monomers (compounds) corresponding to monomeric units represented by Formula (Vf) include, but are not limited to, 4-oxatricyclo[5.2.1.0$^{2,6}$]dec-8-en-5-one, 3-oxatricyclo[5.2.1.0$^{2,6}$]dec-8-en-4-one, 5-oxatricyclo[6.2.1.0$^{2,7}$]undec-9-en-6-one, 4-oxatricyclo[6.2.1.0$^{2,7}$]undec-9-en-5-one, 4-oxapentacyclo[6.5.1.1$^{9,12}$.0$^{2,6}$.0$^{8,13}$]pentadec-10-en-5-one, and 3-oxapentacyclo[6.6.1.1$^{10,13}$.0$^{2,7}$.0$^{9,14}$]hexadec-11-en-6-one, 4-oxapentacyclo[6.6.1.1$^{10,13}$.0$^{2,7}$.0$^{9,14}$]hexadec-11-en-5-one.

[Monomeric Units of Formula (Vg)]

Typical examples of monomers (compounds) corresponding to monomeric units of Formula (Vg) include 8-(meth)acryloyloxy-4-oxatricyclo[5.2.1.0$^{2,6}$]decan-5-one [i.e., 9-(meth)acryloyloxy-4-oxatricyclo[5.2.1.0$^{2,6}$]decan-3-one], 9-(meth)acryloyloxy-4-oxatricyclo[5.2.1.0$^{2,6}$]decan-5-one [i.e., 8-(meth)acryloyloxy-4-oxatricyclo[5.2.1.0$^{2,6}$]decan-3-one], 8-(meth)acryloyloxy-9-hydroxy-4-oxatricyclo[5.2.1.0$^{2,6}$]decan-5-one [i.e., 9-(meth)acryloyloxy-8-hydroxy-4-oxatricyclo[5.2.1.0$^{2,6}$]decan-3-one, 9-(meth)acryloyloxy-8-hydroxy-4-oxatricyclo[5.2.1.0$^{2,6}$]decan-5-one [i.e., 8-((meth)acryloyloxy-9-hydroxy-4-oxatricyclo[5.2.1.0$^{2,6}$]decan-3-one], 8-(meth)acryloyloxy-3-oxatricyclo[5.2.1.0$^{2,6}$]decane-4-one, 9-(meth)acryloyloxy-4-oxatricyclo[6.2.1.0$^{2,7}$]undecan-3-one, 10-(meth)acryloyloxy-4-oxatricyclo[6.2.1.0$^{2,7}$]undecan-3-one, 9-(meth)acryloyloxy-4-oxatricyclo[6.2.1.0$^{2,7}$]undecan-5-one, and 10-(meth)acryloyloxy-4-oxatricyclo[6.2.1.0$^{2,7}$]undecan-5-one.

[Monomeric Units of Formula (Vh)]

As $R^{36}$ in monomeric units of Formula (Vh), exemplary halogen atoms include fluorine, chlorine, and bromine atoms. Exemplary alkyl groups having 1 to 6 carbon atoms include methyl, ethyl, propyl, isopropyl, butyl, isobutyl, s-butyl, t-butyl, pentyl, and hexyl groups; of which alkyl groups having 1 to 4 carbon atoms are preferred, and methyl group is especially preferred. Exemplary substituted alkyl groups having 1 to 6 carbon atoms include halo-substituted alkyl group having 1 to 6 carbon atoms including chloromethyl group and other chloroalkyl groups; and trifluoromethyl, 2,2,2-trifluoroethyl, pentafluoroethyl, and other fluoroalkyl groups, of which fluoroalkyl groups having 1 to 3 carbon atoms are preferred.

$R^{36}$ is preferably hydrogen atom, methyl group or another alkyl group having 1 to 3 carbon atoms, or trifluoromethyl group or another haloalkyl group having 1 to 3 carbon atoms, and $R^{36}$ is especially preferably hydrogen atom or methyl group.

As $R^{37}$, exemplary groups having a lactone skeletons include groups having a lactone skeleton composed of a monocyclic lactone ring such as γ-butyrolactone ring, δ-valerolactone ring, or ε-caprolactone ring; and groups having a lactone skeleton composed of a polycyclic lactone skeleton, such as 6-oxabicyclo[3.2.1$^{1,5}$]octane-7-one ring or 3-oxatricyclo[4.2.1.0$^{4,8}$]nonan-2-one ring. Of these, groups having a lactone skeleton composed of a monocyclic lactone ring are preferred, of which monocyclic groups having a lactone skeleton and composed of γ-butyrolactone ring are more preferred.

The lactone skeleton may have one or more substituents. Exemplary substituents include methyl group and other alkyl groups (e.g., alkyl groups having 1 to 4 carbon atoms), trifluoromethyl group and other haloalkyl groups (e.g., haloalkyl groups having 1 to 4 carbon atoms); chlorine atom, fluorine atom, and other halogen atoms; protected or unprotected hydroxyl groups; protected or unprotected hydroxyalkyl groups; protected or unprotected mercapto groups; protected or unprotected carboxyl groups; protected or unprotected amino groups; and protected or unprotected sulfonic groups. Protecting groups for use herein can be protecting groups customarily used in organic syntheses.

In Formula (Vh), the lactone skeleton in $R^{37}$ may be bound to the ester bond (—COO—) in Formula (Vh) directly, or indirectly through a linkage group. Exemplary linkage groups include methylene, ethylene, propylene, trimethylene, tetramethylene, hexamethylene, and other alkylene groups, of which alkylene groups having 1 to 6 carbon atoms are preferred.

Typical examples of $R^{37}$ include γ-butyrolactone-2-yl groups which may be substituted typically with one or more alkyl groups having 1 to 4 carbon atoms, such as γ-butyrolactone-2-yl group, 3-methyl-γ-butyrolactone-2-yl group, 3,3-dimethyl-γ-butyrolactone-2-yl group, 4-methyl-γ-butyrolactone-2-yl group, 4,4-dimethyl-γ-butyrolactone-2-yl group, 3,4,4-trimethyl-γ-butyrolactone-2-yl group, 3,3,4-trimethyl-γ-butyrolactone-2-yl group, and 3,3,4,4-tetramethyl-γ-butyrolactone-2-yl group; δ-valerolactone-2-yl groups which may be substituted typically with one or more alkyl groups having 1 to 4 carbon atoms, such as δ-valerolactone-2-yl group, 3-methyl-δ-valerolactone-2-yl group, 3,3-dimethyl-δ-valerolactone-2-yl group, 4-methyl-δ-valerolactone-2-yl group, 4,4-dimethyl-δ-valerolactone-2-yl group, 5-methyl-δ-valerolactone-2-yl group, and 5,5-dimethyl-δ-valerolactone-2-yl group; and ε-caprolactone-2-yl groups which may be substituted typically with one or more alkyl groups having 1 to 4 carbon atoms, such as ε-caprolactone-2-yl group, 2-methyl-ε-caprolactone-2-yl group, and 2,2-dimethyl-ε-caprolactone-2-yl group. Of these, preferred are γ-butyrolactone-2-yl groups substituted with one or more (more preferably two) alkyl groups having 1 to 4 carbon atoms, δ-valerolactone-2-yl groups substituted with one or more (more preferably two) alkyl groups having 1 to 4 carbon atoms, and ε-caprolactone-2-yl groups substituted with one or more (more preferably two) alkyl groups having 1 to 4 carbon atoms, of which more preferred are γ-butyrolactone-2-yl groups substituted with one or more (more preferably two) alkyl groups having 1 to 4 carbon atoms, such as 3,3-dimethyl-γ-butyrolactone-2-yl group.

The symbol "M" represents a bivalent organic group having 1 to 6 carbon atoms. Exemplary bivalent organic groups include methylene, ethylene, propylene, butylene, and other alkylene groups, of which alkylene groups having 1 to 6 carbon atoms are preferred; vinylene and other alkenylene groups, of which alkenylene groups having 2 to 6 carbon atoms are preferred; cyclopentylene, cyclohexylene, and other cycloalkenylene groups; and bivalent organic groups each composed of two or more of these bound to each other through a linkage group such as ether bond (—O—), thioether bond (—S—), or ester bond (—COO—; —COO—). Among them, M is typically preferably methylene, ethylene, or propylene. Groups corresponding to the above-exemplified groups, except for being substituted with one or more halogen atoms (of which fluorine atoms are preferred) are also usable herein as M.

Typical examples of monomers represented by Formula (Vh) and having a lactone skeleton include 2-(meth)acryloyloxyacetoxy-3-methyl-γ-butyrolactone [i.e., α-(meth)acryloyloxyacetoxy-β-methyl-γ-butyrolactone], 2-(meth)acryloyloxyacetoxy-3,3-dimethyl-γ-butyrolactone [i.e., α-(meth)acryloyloxyacetoxy-β,β-dimethyl-γ-butyrolactone], 2-(meth)acryloyloxyacetoxy-4-methyl-γ-butyrolactone, 2-(meth)acryloyloxyacetoxy-4,4-dimethyl-γ-butyrolactone, 2-(meth)acryloyloxyacetoxy-3-methyl-δ-valerolactone, 2-(meth)acryloyloxyacetoxy-3,3-dimethyl-δ-valerolactone, 2-(meth)acryloyloxyacetoxy-4-methyl-δ-valerolactone, 2-(meth)acryloyloxyacetoxy-4,4-dimethyl-δ-valerolactone, 2-(meth)acryloyloxyacetoxy-5-methyl-δ-valerolactone, 2-(meth)acryloyloxyacetoxy-5,5-dimethyl-δ-valerolactone, 2-(meth)acryloyloxyacetoxy-3-methyl-ε-caprolactone, and 2-(meth)acryloyloxyacetoxy-3,3-dimethyl-ε-caprolactone.

[Production of Polymeric Compound B]

Though not limited, the polymeric compound (B) is preferably produced through radical polymerization. The polymerization can be performed according to a procedure customarily adopted to the production typically of acrylic polymers, such as solution polymerization, bulk polymerization, suspension polymerization, bulk-suspension polymerization, or emulsion polymerization, of which solution polymerization is most suitable. Of such solution polymerization procedures, drop polymerization is preferred. Specifically, the drop polymerization may be performed, for example, by any of the following processes (i), (ii), and (iii). In the process (i), a solution of monomers in an organic solvent, and a solution of a polymerization initiator in the organic solvent are previously prepared separately, and these solutions are respectively added dropwise to the organic solvent held to a constant temperature. In the process (ii), a mixed solution containing monomers and a polymerization initiator in an organic solvent is prepared and added dropwise to the organic solvent held to a constant temperature. In the process (iii), a solution of monomers in an organic solvent, and a solution of a polymerization initiator in the organic solvent are prepared separately, and the solution of polymerization initiator is added dropwise to the solution of monomers held to a constant temperature.

[Polymerization Initiators]

In the case of radical polymerization, exemplary radical polymerization initiators for use as polymerization initiators include, but are not limited to, azo compounds, peroxide compounds, and redox compounds. Among them, preferred are dimethyl 2,2'-azobisisobutyrate, azobisisobutyronitrile, 2,2'-azobis(2-methylbutyronitrile), t-butyl peroxypivalate, di-t-butyl peroxide, iso-butyryl peroxide, lauroyl peroxide, succinic peroxide, dicinnamyl peroxide, di-n-propyl peroxydicarbonate, t-butylperoxyallyl monocarbonate, benzoyl peroxide, hydrogen peroxide, and ammonium persulfate.

Any of known solvents can be used as the polymerization solvent, and examples thereof include ethers (e.g., chain ethers including glycol ethers such as diethyl ether and propylene glycol monomethyl ether; and cyclic ethers such as tetrahydrofuran and dioxane), esters (e.g., methyl acetate, ethyl acetate, butyl acetate, ethyl lactate, and glycol ether esters such as propylene glycol monomethyl ether acetate), ketones (e.g., acetone, methyl ethyl ketone, methyl isobutyl ketone, and cyclohexanone), amides (e.g., N,N-dimethylacetamide and N,N-dimethylformamide), sulfoxides (e.g., dimethyl sulfoxide), alcohols (e.g., methanol, ethanol, and propanol), hydrocarbons (e.g., aromatic hydrocarbons such as benzene, toluene, and xylene; aliphatic hydrocarbons such as hexane; and alicyclic hydrocarbons such as cyclohexane), and mixtures of these solvents. The polymerization temperature can be chosen within a range typically of from 30° C. to 150° C.

A polymer prepared through polymerization can be purified through precipitation or reprecipitation. A solvent for use in precipitation or reprecipitation may be any of organic solvents and water and may be a mixture of them. As the precipitation or reprecipitation solvent, exemplary organic solvents include hydrocarbons (e.g., aliphatic hydrocarbons such as pentane, hexane, heptane, and octane; alicyclic hydrocarbons such as cyclohexane and methylcyclohexane; and aromatic hydrocarbons such as benzene, toluene, and xylenes), halogenated hydrocarbons (e.g., halogenated aliphatic hydrocarbons such as methylene chloride, chloroform, and carbon tetrachloride; and halogenated aromatic hydrocarbons such as chlorobenzene and dichlorobenzene), nitro compounds (e.g., nitromethane and nitroethane), nitriles (e.g., acetonitrile and benzonitrile), ethers (e.g., chain ethers such as diethyl ether, diisopropyl ether, and dimethoxyethane; and cyclic ethers such as tetrahydrofuran and dioxane), ketones (e.g., acetone, methyl ethyl ketone, and diisobutyl ketone), esters (e.g., ethyl acetate and butyl acetate), carbonates (dimethyl carbonate, diethyl carbonate, ethylene carbonate, and propylene carbonate), alcohols (e.g., methanol, ethanol, propanol, isopropyl alcohol, and butanol), carboxylic acids (e.g., acetic acid), and solvent mixtures containing these solvents.

Of such organic solvents for use as the precipitation or reprecipitation solvent, solvents containing at least a hydrocarbon are preferred, of which those containing an aliphatic hydrocarbon such as hexane are more preferred. In such a solvent containing at least a hydrocarbon, the ratio (by weight; at 25° C.) of the hydrocarbon (for example, an aliphatic hydrocarbon such as hexane) to another solvent or solvents is typically from about 10:90 to about 99:1, preferably from about 30:70 to about 98:2, and more preferably from about 50:50 to about 97:3.

The polymeric compound (B) has a weight-average molecular weight (Mw) of typically about 1000 to 7000 and preferably about 2000 to 5000 and a molecular weight distribution (Mw/Mn) of typically about 1.2 to 2.5. The symbol "Mn" represents a number-average molecular weight, and both Mn and Mw are values in terms of a polystyrene.

[Production of Polymer (A') for Lithographic Purposes]

It is also acceptable that the polymeric compound (B) prepared through polymerization in the form of a polymerization solution is directly combined with an acid catalyst without a precipitation or reprecipitation operation, further combined with a compound (C) added dropwise, aged, subjected to a cross-linking reaction to give a polymer (A') for lithographic purposes, and the polymer (A') is then subjected to a precipitation or reprecipitation operation.

When the polymeric compound (B) contains two or more repeating structural units represented by General Formula (II), all the repeating structural units represented by General Formula (II) may be reacted with the compound (C), but it is also preferred that part of the structures (II) in the polymeric compound (B) remain as unreacted in the resulting polymer (A'). Such unreacted repeating structural unit(s) represented by General Formula (II) remained in the polymer (A') for lithographic purposes impart, to the resulting film, adhesion to a substrate or bottom antireflection coating as a workpiece, and this suppresses pattern collapse. Of such repeating structural units represented by General Formula (II) in the polymeric compound (B), the proportion of those to be reacted with the compound (C) is preferably within a range of 10 to 100 percent by mole and more preferably within a range of 20 to 90 percent by mole, base on the total moles of the repeating structural units represented by General Formula (II).

[Cross-Linking]

The cross-linking reaction of the polymeric compound (B) with the compound (C) is preferably performed in a system in the form of a solution. Exemplary solvents for use herein include known solvents including ethers (e.g., chain ethers including diethyl ether, and glycol ethers such as propylene glycol monomethyl ether; and cyclic ethers such as tetrahydrofuran and dioxane), esters (e.g., methyl acetate, ethyl acetate, butyl acetate, ethyl lactate, and glycol ether esters such as propylene glycol monomethyl ether acetate), ketones (e.g., acetone, methyl ethyl ketone, methyl isobutyl ketone, and cyclohexanone), amides (e.g., N,N-dimethylacetamide and N,N-dimethylformamide), sulfoxides (e.g., dimethyl sulfoxide), alcohols (e.g., methanol, ethanol, and propanol), hydrocarbons (aromatic hydrocarbons such as benzene, toluene, and xylenes; aliphatic hydrocarbons such as hexane; and alicyclic hydrocarbons such as cyclohexane), and mixtures of these solvents. For suppressing side reactions typically with the multifunctional vinyl ether and the catalyst, the solvent for use herein is preferably one having no reactivity with these compounds. Specific examples of such solvents include tetrahydrofuran (THF), cyclohexanone, propylene glycol monomethyl ether acetate (PGMEA), and hydrocarbon compounds. Initially, the polymeric compound (B) is dissolved in the solvent, and the acid catalyst and the compound (C) are added thereto at a cross-linking temperature. The addition may be performed at once, or by fractionated or divided addition, or by continuous dropwise addition. The cross-linking temperature can be appropriately chosen within a range typically from about 0° C. to about 150° C.

Each of different polymeric compounds (B) can be used alone or in combination. The compound (C) is used in an amount of 0.01 percent by weight to 100 percent by weight and preferably 0.03 percent by weight to 50 percent by weight, relative to the weight of the polymeric compounds (B) used in the cross-linking reaction. The compound (C), if used in an amount of less than 0.01 percent by weight, may not sufficiently undergo a cross-linking reaction to thereby fail to give a fine and sharp resist pattern. The compound (C), if used in an amount of more than 100 percent by weight, may cause the polymer to have an excessively high degree of cross-linking, and this may cause poor solubility of the polymer in a resist solvent. When the cross-linking reaction is performed using the polymerization solution after the polymerization of the polymeric compound (B), the compound (C) is used in an amount within the above-specified range, except for based on the total weight of monomers used to constitute the polymeric compound (B), instead of based on the weight of the polymeric compound (B).

An acid catalyst is used in the cross-linking reaction for a higher reaction rate. Exemplary acid catalysts include sulfuric acid, hydrochloric acid, p-toluenesulfonic acid, pyridinium p-toluenesulfonate, and boron trifluoride. Of these, preferred examples are hydrochloric acid, p-toluenesulfonic acid, and pyridium p-toluenesulfonate. The acid catalyst is used in an amount of generally from 0.01 to 5 percent by mole and preferably from 0.1 to 3 percent by mole, to the amount of the compound (C) used.

[Purification Process After Cross-Linking]

After the completion of the cross-linking reaction, the resulting reaction solution (reaction mixture) is added to a poor solvent in which the formed resin (polymer) has a low solubility, so as to precipitate the polymer. It is also preferred to recover the precipitates (polymer) and to subject the recovered precipitates to redissolution and reprecipitation to thereby remove residual monomers and low-molecular-weight compounds. A solvent for use in the precipitation or reprecipitation may be any of organic solvents and water, or a solvent mixture of them. Exemplary organic solvents for use as the precipitation or reprecipitation solvent include hydrocarbons (e.g., aliphatic hydrocarbons such as pentane, hexane, heptane, and octane; alicyclic hydrocarbons such as cyclohexane and methylcyclohexane; and aromatic hydrocarbons such as benzene, toluene, and xylenes), halogenated hydrocarbons (e.g., halogenated aliphatic hydrocarbons such as methylene chloride, chloroform, and carbon tetrachloride; and halogenated aromatic hydrocarbons such as chlorobenzene and dichlorobenzene), nitro compounds (e.g., nitromethane and nitroethane), nitriles (e.g., acetonitrile and benzonitrile), ethers (e.g., chain ethers such as diethyl ether, diisopropyl ether, and dimethoxyethane; and cyclic ethers such as tetrahydrofuran and dioxane), ketones (e.g., acetone, methyl ethyl ketone, and diisobutyl ketone), esters (e.g., ethyl acetate and butyl acetate), carbonates (e.g., dimethyl carbonate, diethyl carbonate, ethylene carbonate, and propylene carbonate), alcohols (e.g., methanol, ethanol, propanol, isopropyl alcohol, and butanol), carboxylic acids (e.g., acetic acid), and solvent mixtures containing these solvents.

Of such organic solvents for use as the precipitation or reprecipitation solvent, solvents containing at least a hydrocarbon are preferred, of which those containing an aliphatic hydrocarbon such as hexane are more preferred. In such a solvent containing at least a hydrocarbon, the ratio (by weight; at 25° C.) of the hydrocarbon (for example, an aliphatic hydrocarbon such as hexane) to another solvent or solvents is typically from about 10:90 to about 100:0, preferably from about 30:70 to about 100:0, and more preferably from about 50:50 to about 100:0.

[Molecular Weight]

The formed cross-linked polymer (polymer (A') for lithographic purposes) has a weight-average molecular weight (Mw) of typically about 4500 to 200000, preferably about 4600 to 200000, and especially preferably 5000 to 100000 and has a molecular weight distribution (Mw/Mn) of typically about 1.2 to 10.0. The symbol Mn represents a number-average molecular weight, and both Mn and Mw are values in terms of a polystyrene.

The polymer (A') for lithographic purposes may contain unreacted repeating structural units represented by General Formula (II) in a content of typically 1 to 40 percent by mole, preferably 1 to 35 percent by mole, and especially preferably 5 to 30 percent by mole, based on the amount of total repeating units. Independently, the polymer (A) for lithographic purposes may contain unreacted repeating structural units represented by General Formula (II) in a content of typically 1 to 40 percent by mole, preferably 1 to 35 percent by mole, and especially preferably 5 to 30 percent by mole, based on the amount of total repeating units.

[Compositions for Lithographic Purposes]

A composition for lithographic purposes according to an embodiment of the present invention includes the polymer (A') for lithographic purposes which is produced according to the present invention, a light-activatable acid generator, and a resist solvent. Typically, a composition for lithographic purposes can be prepared, for example, by preparing a solution of the polymer for lithographic purposes in the above manner, and adding a light-activatable acid generator to the solution.

[Light-Activatable Acid Generators]

Exemplary light-activatable acid generators include common or known compounds that efficiently generate an acid upon the irradiation with light (exposure), including diazonium salts, iodonium salts (e.g., diphenyliodonium hexafluorophosphate), sulfonium salts (e.g., triphenylsulfonium hexafluoroantimonate, triphenylsulfonium hexafluorophosphate, and triphenylsulfonium methanesulfonate), sulfonic esters [e.g., 1-phenyl-1-(4-methylphenyl)sulfonyloxy-1-benzoylmethane, 1,2,3-trisulfonyloxymethylbenzene, 1,3-dinitro-2-(4-phenylsulfonyloxymethyl)benzene, and 1-phenyl-1-(4-methylphenylsulfonyloxymethyl)-1-hydroxy-1-benzoylmethane], oxathiazole derivatives, s-triazine derivatives, disulfone derivatives (e.g., diphenyldisulfone), imide compounds, oxime sulfonates, diazonaphthoquinone, and benzoin tosylate. Each of different light-activatable acid generators can be used alone or in combination.

The amount of light-activatable acid generators can be chosen according typically to the strength of an acid generated as a result of light application (exposure) and the proportions of respective repeating units in the polymer (resin for photoresist). For example, the amount is chosen within ranges of typically about 0.1 to 30 parts by weight, preferably about 1 to 25 parts by weight, and more preferably about 2 to 20 parts by weight, per 100 parts by weight of the polymer.

[Resist Solvents]

Exemplary resist solvents include the glycol solvents, ester solvents, and ketone solvents exemplified as the polymerization solvent as above, and mixtures of these solvents. Among them, preferred are propylene glycol monomethyl ether, propylene glycol monomethyl ether acetate, ethyl lactate, methyl isobutyl ketone, methyl amyl ketone, cyclohexanone, and mixtures of them, of which more preferred are solvents containing at least propylene glycol monomethyl ether acetate, such as a single solvent of propylene glycol monomethyl ether acetate alone; a solvent mixture containing propylene glycol monomethyl ether acetate and propylene glycol monomethyl ether; a solvent mixture containing propylene glycol monomethyl ether acetate and ethyl lactate; and a solvent mixture containing propylene glycol monomethyl ether acetate and cyclohexanone.

[Polymer Concentration in Composition for Lithographic Purposes]

The composition for lithographic purposes has a polymer concentration (concentration of the polymer (A') for lithographic purposes) of typically about 3 to 40 percent by weight.

The composition for lithographic purposes may further contain any of other components including alkali-soluble components such as alkali-soluble resins (e.g., novolak resins, phenol resins, imide resin, and carboxyl-containing resins) and colorants (e.g., dyestuffs).

The resulting composition for lithographic purposes is useable for highly accurate fine patterning (formation of a fine pattern) by applying the composition to a base or substrate, drying the applied film, applying light through a predetermined mask to the film (resist film) (or further carrying out post-exposure bake) to form a latent-image pattern, and developing the latent-image pattern.

Exemplary materials for bases or substrates include silicon wafers, metals, plastics, glass, and ceramics. The application of the photoresist composition can be performed using a common coating device such as spin coater, dip coater, or roller coater. The coated film has a thickness of typically about 0.05 to 20 µm and preferably about 0.1 to 2 µm.

[Exposure Process]

The light application (exposure) can be performed using rays with various wavelengths, such as ultraviolet rays and X-rays. For semiconductor resists, g-ray (g-line), i-ray (i-line), excimer laser beams (e.g., XeCl, KrF, KrCl, ArF, or ArCl laser beams), and extreme ultraviolet rays (EUV) are usable. The composition for lithographic purposes according to the present invention is suitable especially for the exposure to a far-ultraviolet ray having a wavelength of 220 nm or less. The exposure is performed at an energy of typically about 1 to 1000 mJ/cm$^2$ and preferably about 5 to 100 mJ/cm$^2$.

The light application allows the light-activatable acid generator to generate an acid, and this acid acts on a protecting group (leaving group) typically of carboxyl group of the repeating unit which will be soluble in an alkali by the action of an acid (repeating unit having a group capable of leaving with an acid) of the photoresist polymeric compound to leave immediately to form a group that helps the polymer to be soluble, such as carboxyl group. The acid also cleaves acetal bonds in cross-links, and the polymer chains in exposed portions becomes to have lower molecular weights. Thus, the subsequent development with water or an alkaline developer gives a predetermined pattern with a high accuracy.

A semiconductor device can be highly accurately and efficiently manufactured by patterning according to the above-mentioned steps.

EXAMPLES

The present invention will be illustrated in further detail with reference to several working examples below. It should be noted, however, that these examples are never construed to limit the scope of the present invention.

Referential Example 1

Synthesis of 2,6-Naphthalenediol Divinyl Ether

To a solution of a mixture of di-µ-chlorobis(1,5-cyclooctadiene)diiridium(I) [Ir(cod)Cl]$_2$ (2.1 g, 3.1 mmol) and sodium carbonate (26.2 g, 312.2 mmol) in toluene (250 g) were added 2,6-dihydroxynaphthalene (25 g, 156.1 mmol) and vinyl propionate (62.5 g, 624.3 mmol), followed by stirring in an argon atmosphere at 110° C. for 4 hours. The reaction mixture was analyzed by gas chromatography to find that 2,6-bis(vinyloxy)naphthalene was formed in a yield of 55%.

[Spectral Data of 2,6-bis(vinyloxy)naphthalene]
$^1$H-NMR (CDCl$_3$) δ: 4.50 (2H, d), 4.81 (2H, d), 6.75 (2H, dd), 7.22 (2H, d), 7.30 (2H, s), 7.71 (2H, d)

Referential Example 2

Synthesis of 2,6-Naphthalenedimethylol Divinyl Ether

To a solution of a mixture of di-μ-chlorobis(1,5-cyclooctadiene)diiridium(I) [Ir (cod)Cl]$_2$ (0.86 g, 1.3 mmol) and sodium carbonate (10.7 g, 127.5 mmol) in toluene (100 g) were added 2,6-naphthalenedimethanol (12.0 g, 63.8 mmol) and vinyl propionate (25.5 g, 255.0 mmol), followed by stirring in an argon atmosphere at 110° C. for 6 hours. The reaction mixture was analyzed by gas chromatography to find that 2,6-bis(vinyloxymethyl)naphthalene was formed in a yield of 40%.

[Spectral Data of 2,6-bis(vinyloxymethyl)naphthalene]
$^1$H-NMR (CDCl$_3$) δ: 4.11 (2H, d), 4.36 (2H, d), 4.92 (4H, s), 6.61 (2H, dd), 7.47 (2H, d), 7.81 (2H, s), 7.84 (2H, d)

Synthetic Example 1

Synthesis of Polymeric Compound of Following Structure

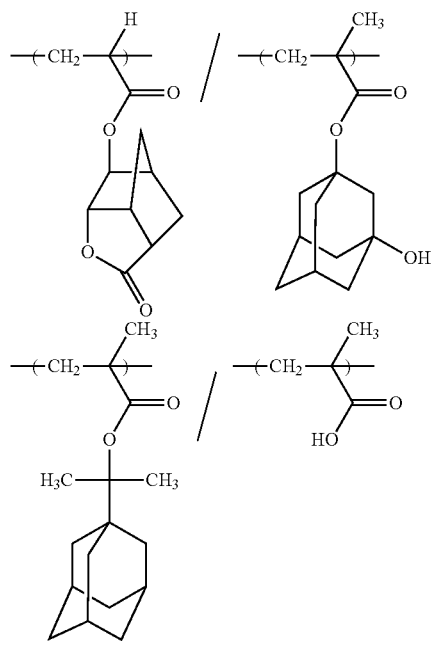

[Chem. 18]

In a nitrogen atmosphere, 128.9 g of propylene glycol monomethyl ether acetate (PGMEA) and 55.3 g of propylene glycol monomethyl ether (PGME) were placed in a round-bottom flask equipped with a reflux condenser, a stirring bar, a three-way stopcock, and a thermometer; and, while keeping the temperature to 90° C. and stirring, a solution mixture was added dropwise thereto over 5 hours, followed by further stirring at the same temperature (90° C.) for 2 hours. The solution mixture contained 26.5 g (127.3 mmol) of 5-acryloyloxy-3-oxatricyclo[4.2.1.0$^{4,8}$]nonan-2-one, 6.0 g (25.4 mmol) of 1-hydroxy-5-methacryloyloxyadamantane, 13.3 g (50.7 mmol) of 1-(1-methacryloyloxy-1-methylethyl)adamantane, 4.4 g (51.1 mmol) of methacrylic acid, 4.02 g of dimethyl 2,2'-azobis(isobutyrate)dimethyl (supplied by Wako Pure Chemical Industries Ltd. under the trade name "V-601"), 69.4 g of PGMEA, and 29.8 g of PGME. After being cooled, the polymerization solution (reaction mixture after polymerization) was added with stirring to 2800 g of a 1:9 (by weight) mixture of ethyl acetate and heptane to give precipitates. The precipitates were collected through filtration and dried to give a resin. The resulting resin had a weight-average molecular weight (Mw) of 4200 and a molecular weight distribution (Mw/Mn) of 2.0.

Synthetic Example 2

Synthesis of Polymeric Compound of Following Structure

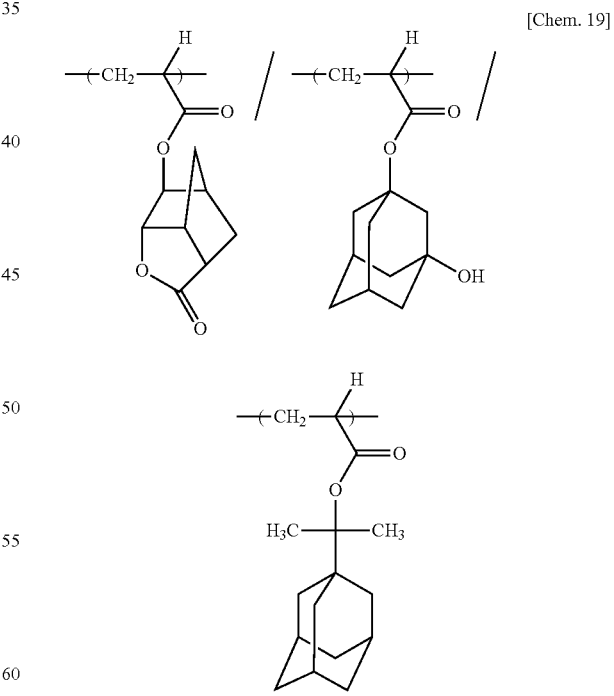

[Chem. 19]

In a nitrogen atmosphere, 23.8 g of propylene glycol monomethyl ether acetate (PGMEA) and 10.2 g of propylene glycol monomethyl ether (PGME) were placed in a round-bottom flask equipped with a reflux condenser, a stirring bar, a three-way stopcock, and a thermometer; and, while keeping the temperature to 90° C. and stirring, a solution mixture was added dropwise thereto over 5 hours, followed by further stirring at the same temperature (90° C.) for 2 hours. The solution mixture contained 14.0 g (67.2 mmol) of 5-acryloyloxy-3-oxatricyclo[4.2.1.0$^{4,8}$]nonan-2-one, 6.0 g (27.0 mmol) of 1-hydroxy-5-acryloyloxyadamantane, 10.0 g (40.3 mmol) of 1-(1-acryloyloxy-1-methylethyl)adamantane, 2.40 g of dimethyl 2,2'-azobis(isobutyrate)dimethyl (supplied by Wako Pure Chemical Industries Ltd. under the trade name "V-601"), 99.2 g of PGMEA, and 40.8 g of PGME. After being cooled, the polymerization solution was added with stirring to 1800 g of a 1:9 (by weight) mixture of ethyl acetate and heptane, to give precipitates. The precipitates were collected through filtration and dried to give a resin. The resulting resin had a weight-average molecular weight (Mw) of 3700 and a molecular weight distribution (Mw/Mn) of 1.7.

Synthetic Example 3

Synthesis of Polymeric Compound of Following Structure

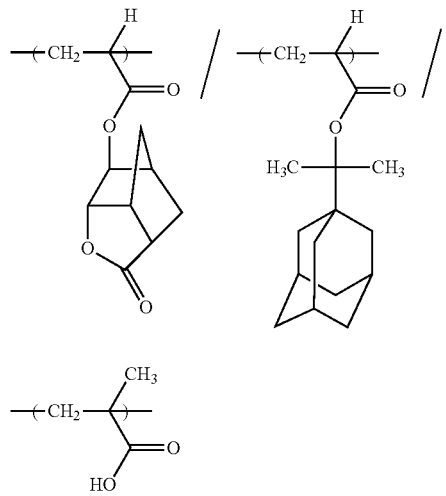

In a nitrogen atmosphere, 23.8 g of propylene glycol monomethyl ether acetate (PGMEA) and 10.2 g of PGME (propylene glycol monomethyl ether) were placed in a round-bottom flask equipped with a reflux condenser, a stirring bar, a three-way stopcock, and a thermometer; and, while keeping the temperature to 90° C. and stirring, a solution mixture was added dropwise thereto over 5 hours, followed by further stirring at the same temperature (90° C.) for 2 hours. The solution mixture contained 16.0 g (76.8 mmol) of 5-acryloyloxy-3-oxatricyclo[4.2.1.0$^{4,8}$]nonan-2-one, 11.5 g (46.3 mmol) of 1-(1-acryloyloxy-1-methylethyl)adamantane, 2.6 g (30.2 mmol) of methacrylic acid, 2.40 g of dimethyl 2,2'-azobis(isobutyrate)dimethyl (supplied by Wako Pure Chemical Industries Ltd. under the trade name "V-601"), 115.9 g of PGMEA, and 20.1 g of PGME. After being cooled, the polymerization solution was added with stirring to 1800 g of a 1:9 (by weight) mixture of ethyl acetate and heptane, to give precipitates. The precipitates were collected through filtration and dried to give a resin. The resulting resin had a weight-average molecular weight (Mw) of 3400 and a molecular weight distribution (Mw/Mn) of 1.6.

Comparative Synthetic Example 1

Synthesis of Polymeric Compound of Following Structure

[Chem. 21]

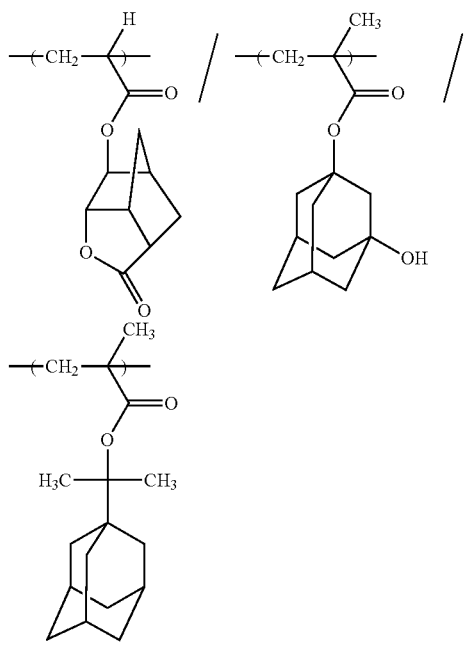

In a nitrogen atmosphere, 41.7 g of propylene glycol monomethyl ether acetate (PGMEA) and 17.9 g of PGME (propylene glycol monomethyl ether) were placed in a round-bottom flask equipped with a reflux condenser, a stirring bar, a three-way stopcock, and a thermometer; and, while keeping the temperature to 80° C. and stirring, a solution mixture was added dropwise thereto over 5 hours, followed by further stirring at the same temperature (80° C.) for 2 hours. The solution mixture contained 10.7 g (51.4 mmol) of 5-acryloyloxy-3-oxatricyclo[4.2.1.0$^{4,8}$]nonan-2-one, 6.0 g (25.4 mmol) of 1-hydroxy-5-methacryloyloxyadamantane, 13.4 g (51.1 mmol) of 1-(1-methacryloyloxy-1-methylethyl)adamantane, 1.00 g of dimethyl 2,2'-azobis(isobutyrate)dimethyl (supplied by Wako Pure Chemical Industries Ltd. under the trade name "V-601"), 77.4 g of PGMEA, and 33.2 g of PGME. After being cooled, the polymerization solution was added with stirring to 1800 g of a 1:9 (by weight) mixture of ethyl acetate and heptane, to give precipitates. The precipitates were collected through filtration and dried to give a resin. The resulting resin had a weight-average molecular weight (Mw) of 10700 and a molecular weight distribution (Mw/Mn) of 2.7.

Comparative Synthetic Example 2

Synthesis of Polymeric Compound of Following Structure

[Chem. 22]

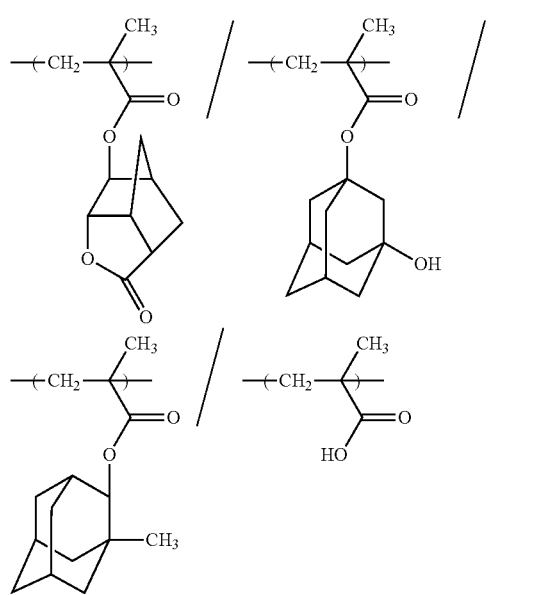

In a nitrogen atmosphere, 23.8 g of propylene glycol monomethyl ether acetate (PGMEA) and 10.2 g of propylene glycol monomethyl ether (PGME) were placed in a round-bottom flask equipped with a reflux condenser, a stirring bar, a three-way stopcock, and a thermometer; and, while keeping the temperature to 85° C. and stirring, a solution mixture was added dropwise thereto over 5 hours, followed by further stirring at the same temperature (85° C.) for 2 hours. The solution mixture contained 12.4 g (55.8 mmol) of 5-methacryloyloxy-3-oxatricyclo[4.2.1.0$^{4,8}$]nonan-2-one, 6.6 g (27.9 mmol) of 1-hydroxy-5-methacryloyloxyadamantane, 9.8 g (41.8 mmol) of 2-methyl-2-adamantyl methacrylate, 1.2 g (13.9 mmol) of methacrylic acid, 1.51 g of dimethyl 2,2'-azobis(isobutyrate)dimethyl (supplied by Wako Pure Chemical Industries Ltd. under the trade name "V-601"), 77.4 g of PGMEA, 33.2 g of PGME. After being cooled, the polymerization solution was added with stirring to 1800 g of a 1:9 (by weight) mixture of ethyl acetate and heptane, to give precipitates. The precipitates were collected through filtration and dried to give a resin. The resulting resin had a weight-average molecular weight (Mw) of 7200 and a molecular weight distribution (Mw/Mn) of 1.8.

Example 1

Preparation of Polymer for Lithographic Purposes

In 10 g of cyclohexanone (CHO), 1.4 g of the polymeric compound obtained from Synthetic Example 1 was dissolved to give a homogeneous solution, followed by uniformly dispersing 0.005 g of p-toluenesulfonic acid therein to give a dispersion. Independently, 0.4 g of 2,6-naphthalenedimethylol divinyl ether obtained from Referential Example 2 was uniformly dissolved in 4.0 g of CHO, and this solution was combined with the dispersion, followed by stirring at room temperature for 2 hours. After the completion of the reaction, the reaction mixture was neutralized with 1.5 g of a 1 percent by weight solution of triethylamine in tetrahydrofuran (THF). The neutralized reaction mixture was reprecipitated from 140 g of a 7:3 (by weight) mixture of heptane and ethyl acetate, from which a wet polymer was recovered through filtration under reduced pressure, dried at 45° C. under reduced pressure for 10 hours, and thereby yielded a polymer "a" for lithographic purposes. The polymer "a" for lithographic purposes had a weight-average molecular weight Mw of 24100 and a molecular weight distribution Mw/Mn of 3.9.

[Preparation of Composition for Lithographic Purposes]

The polymer "a" for lithographic purposes (0.2 g), triphenylsulfonium trifluoromethanesulfonate (0.006 g) as a light-activatable acid generator, and triethanolamine (0.0006 g) as an organic basic compound were mixed, the mixture was dissolved in a 6:4 (by weight) mixture of propylene glycol monomethyl ether acetate and propylene glycol monomethyl ether so as to have a concentration of the polymer of 6.7 percent by weight, the solution was filtrated through a 0.1-μm microfilter, and thereby yielded a composition "a" for lithographic purposes.

Example 2)

Preparation of Polymer for Lithographic Purposes

In 10 g of cyclohexanone (CHO), 0.7 g of the resin obtained from Synthetic Example 2 was dissolved to give a homogeneous solution, followed by uniformly dispersing 0.005 g of p-toluenesulfonic acid therein to give a dispersion. Independently, 0.2 g of 2,6-naphthalenedimethylol divinyl ether obtained from Referential Example 2 was uniformly dissolved in 4.0 g of CHO, and the resulting solution was combined with the dispersion, followed by stirring at room temperature for 2 hours. After the completion of the reaction, the reaction mixture was neutralized with 1.5 g of a 1 percent by weight solution of triethylamine in tetrahydrofuran (THF). The neutralized reaction mixture was reprecipitated from 140 g of a 7:3 (by weight) mixture of heptane and ethyl acetate, from which a wet polymer was recovered through filtration under reduced pressure, dried at 45° C. under reduced pressure for 10 hours, and thereby yielded a polymer "b" for lithographic purposes. The polymer "b" for lithographic purposes had a weight-average molecular weight Mw of 6300 and a molecular weight distribution Mw/Mn of 2.8.

[Preparation of Composition for Lithographic Purposes]

A composition "b" for lithographic purposes was prepared by the procedure of [Preparation of Composition for Lithographic Purposes] in Example 1, except for using the polymer "b" for lithographic purposes instead of the polymer "a" for lithographic purposes.

Example 3

Preparation of Polymer for Lithographic Purposes

In 10 g of cyclohexanone (CHO), 0.7 g of the resin obtained from Synthetic Example 3 was uniformly dissolved, followed by uniformly dispersing 0.005 g of p-toluenesulfonic acid therein to give a dispersion. Independently, 0.2 g of 2,6-naphthalenedimethylol divinyl ether obtained from Referential Example 2 was uniformly dissolved in 4.0 g of CHO, and this solution was combined with the dispersion, followed by stirring at room temperature for 2 hours. After the completion of the reaction, the reaction mixture was neutralized with 1.5 g of a 1 percent by weight solution of triethylamine in tetrahydrofuran (THF). The neutralized reaction mixture was reprecipitated from 140 g of a 7:3 (by weight) mixture of heptane and ethyl acetate, from which a wet polymer was recovered through filtration under reduced pressure, dried at 45° C. under reduced pressure for 10 hours, and thereby yielded a polymer "c" for lithographic purposes. The polymer "c" for lithographic purposes had a weight-average molecular weight Mw of 4600 and a molecular weight distribution Mw/Mn of 2.2.

[Preparation of Composition for Lithographic Purposes]

A composition "c" for lithographic purposes was prepared by the procedure of [Preparation of Composition for Lithographic Purposes] in Example 1, except for using the polymer "c" for lithographic purposes instead of the polymer "a" for lithographic purposes.

Example 4

Preparation of Polymer for Lithographic Purposes

In 10 g of cyclohexanone (CHO), 1.4 g of the resin obtained from Synthetic Example 1 was uniformly dissolved, followed by uniformly dispersing 0.005 g of p-toluenesulfonic acid therein to give a dispersion. Independently, 0.2 g of 2,6-naphthalenedimethylol divinyl ether obtained from Referential Example 2 was uniformly dissolved in 4.0 g of CHO, and this solution was combined with the dispersion, followed by stirring at room temperature for 2 hours. After the completion of the reaction, the reaction mixture was neutralized with 1.5 g of a 1 percent by weight solution of triethylamine in tetrahydrofuran (THF). The neutralized reaction mixture was reprecipitated from 140 g of a 7:3 (by weight) mixture of heptane and ethyl acetate, from which a wet polymer was recovered through filtration under reduced pressure, dried at 45° C. under reduced pressure for 10 hours, and thereby yielded a polymer "d" for lithographic purposes. The polymer "d" for lithographic purposes had a weight-average molecular weight Mw of 6600 and a molecular weight distribution Mw/Mn of 2.6.

[Preparation of Composition for Lithographic Purposes]

A composition "d" for lithographic purposes was prepared by the procedure of [Preparation of Composition for Lithographic Purposes] in Example 1, except for using the polymer "d" for lithographic purposes instead of the polymer "a" for lithographic purposes.

Example 5

Preparation of Polymer for Lithographic Purposes

In 10 g of cyclohexanone (CHO), 1.4 g of the resin obtained from Synthetic Example 1 was uniformly dissolved, followed by uniformly dispersing 0.005 g of p-toluenesulfonic acid therein to give a dispersion. Independently, 0.5 g of 2,6-naphthalenedimethylol divinyl ether obtained from Referential Example 2 was uniformly dissolved in 4.0 g of CHO, and this solution was combined with the dispersion, followed by stirring at room temperature for 2 hours. After the completion of the reaction, the reaction mixture was neutralized with 1.5 g of a 1 percent by weight solution of triethylamine in tetrahydrofuran (THF). The neutralized reaction mixture was reprecipitated from 140 g of a 7:3 (by weight) mixture of heptane and ethyl acetate, from which a wet polymer was recovered through filtration under reduced pressure, dried at 45° C. under reduced pressure for 10 hours to give a polymer. The polymer "e" for lithographic purposes had a weight-average molecular weight Mw of 77400 and a molecular weight distribution Mw/Mn of 8.7.

[Preparation of Composition for Lithographic Purposes]

A composition "e" for lithographic purposes was prepared by the procedure of [Preparation of Composition for Lithographic Purposes] in Example 1, except for using the polymer "e" for lithographic purposes instead of the polymer "a" for lithographic purposes.

Example 6

Preparation of Polymer for Lithographic Purposes

A polymer "f" for lithographic purposes was prepared by the procedure of Example 1, except for using, as a crosslinking agent, 1,4-benzenedimethylol divinyl ether instead of 2,6-naphthalenedimethylol divinyl ether. The polymer "f" for lithographic purposes had a weight-average molecular weight Mw of 32000 and a molecular weight distribution Mw/Mn of 4.0.

[Preparation of Composition for Lithographic Purposes]

A composition "f" for lithographic purposes was prepared by the procedure of [Preparation of Composition for Lithographic Purposes] in Example 1, except for using the polymer "f" for lithographic purposes instead of the polymer "a" for lithographic purposes.

Comparative Example 1

Preparation of Composition for Lithographic Purposes

A composition "g" for lithographic purposes was prepared by the procedure of [Preparation of Composition for Lithographic Purposes] in Example 1, except for using the polymeric compound obtained from Comparative Synthetic Example 1 instead of the polymer "a" for lithographic purposes.

Comparative Example 2

Preparation of Composition for Lithographic Purposes

A composition "h" for lithographic purposes was prepared by the procedure of [Preparation of Composition for Lithographic Purposes] in Example 1, except for using the polymeric compound obtained from comparative Synthetic Example 2 instead of the polymer "a" for lithographic purposes.

Comparative Example 3

The procedure of [Preparation of Polymer for Lithographic Purposes] in Example 1 was repeated, except for using 2,6-naphthalenediol divinyl ether instead of 2,6-naphthalenedimethylol divinyl ether. The molecular weight of the polymer did not change between before and after the reaction, indicating that a cross-linking reaction did not proceed. The amount of 2,6-naphthalenediol divinyl ether in the reaction mixture after the reaction was determined to find that 2,6-naphthalenediol divinyl ether remained while being little consumed. This demonstrates that the cross-linking reaction does not proceed if using a vinyl ether directly bound to an aromatic compound having no substituent.

(Evaluation)

Each of the compositions for lithographic purposes obtained from Examples 1 to 6 and Comparative Examples 1 and 2 was applied to a silicon wafer using a spin coater, dried at 100° C. for 60 seconds, and thereby yielded a series of lithographic films about 0.4 μm thick. The lithographic films were respectively irradiated with ArF excimer laser beams (193 nm) through a positive-working mask at different light exposures. The films were subjected to a post-exposure heating (post-exposure bake) at 100° C. for 60 seconds, developed with a 2.38% aqueous tetramethylammonium hydroxide solution, rinsed with distilled water, and thereby yielded exposed patterns. The results of exposure are shown in Table 1 below. At respective light exposures, a sample which was developed clearly in exact accordance with the shape of the mask was evaluated as "Good", whereas a sample which was not developed or was developed but not in accordance with the shape of the mask was evaluated as "Failure".

Independently, the surface roughness of the samples was determined by scanning, in a straight line of 1000 nm, the surface of an exposed portion where the resist film was developed partway. The scanning was performed with an atomic force microscope (AFM). The determined results are shown in Table 1.

TABLE 1

| Light exposure (mJ/cm$^2$) | 2 | 5 | 10 | 25 | Average roughness (nm) |
|---|---|---|---|---|---|
| Example 1 | Failure | Good | Good | Good | 5.4 |
| Example 2 | Failure | Good | Good | Good | 4.7 |
| Example 3 | Failure | Failure | Good | Good | 4.8 |
| Example 4 | Failure | Good | Good | Good | 5.3 |
| Example 5 | Failure | Good | Good | Good | 6.1 |
| Example 6 | Failure | Failure | Failure | Good | 7.4 |
| Comparative Example 1 | Failure | Failure | Failure | Good | 12.5 |
| Comparative Example 2 | Failure | Failure | Failure | Good | 13.7 |

INDUSTRIAL APPLICABILITY

The polymers for lithographic purposes according to the present invention, when adopted to lithographic purposes, allow very fine and sharp patterning and are very advantageously usable especially in the manufacture of highly integrated semiconductor devices where highly precise working is required.

The invention claimed is:

1. A polymer for lithographic purposes, comprising:
at least a repeating structural unit represented by General Formula (I):

[Chem. 1]

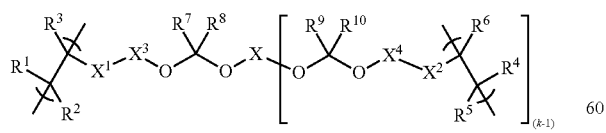

and at least one repeating structural unit, each having a group capable of leaving with an acid to allow the residual moiety to be soluble in an alkali, wherein the repeating structural units are represented by General Formulae (IVa), (IVb), (IVc), (IVd), and (IVe):

[Chem. 4]

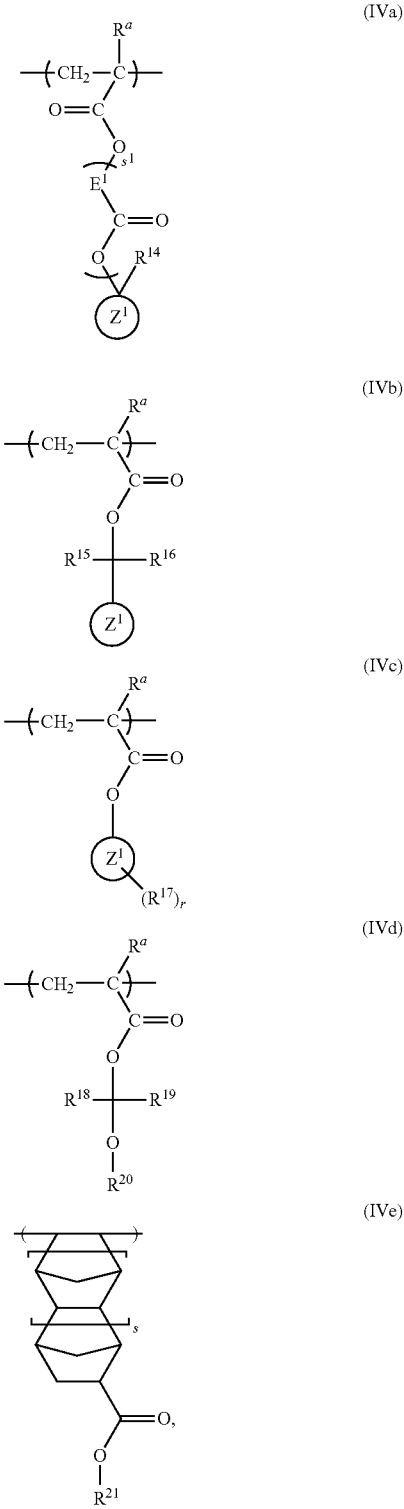

wherein
$R^1$, $R^3$, $R^4$, and $R^6$ each independently represent hydrogen atom, a halogen atom, cyano group, an alkyl group, or a haloalkyl group;

$R^2$ and $R^5$ each independently represent hydrogen atom, cyano group, —CO—$OR^A$, or —CON($R^B$)($R^C$);

$X^1$ and $X^2$ each independently represent single bond, or a substituted or unsubstituted bivalent alkylene, alkenylene, or cycloalkylene group, or —O—, —$SO_2$—, —O—$COR^D$—, —CO—O—$R^E$—, or —CO—N($R^F$)—$R^G$—;

$X^3$ and $X^4$ each independently represent single bond or —CO—;

$R^7$, $R^8$, $R^9$, and $R^{10}$ each independently represent hydrogen atom, an alkyl group, or a cycloalkyl group, wherein $R^7$ and $R^8$ may be bound to each other to form a ring with the adjacent carbon atom, and wherein $R^9$ and $R^{10}$ may be bound to each other to form a ring with the adjacent carbon atom;

X represents a substituted or unsubstituted group having a valency of "k" and including at least one aromatic cyclic group and at least one nonaromatic group;

"k" denotes an integer of 2 or more;

$R^A$ represents hydrogen atom, or an alkyl group, a cycloalkyl group, an alkenyl group, or a group decomposable by the action of an acid;

$R^B$, $R^C$, and $R^F$ each independently represent hydrogen atom, an alkyl group, a cycloalkyl group, or an alkenyl group, wherein $R^B$ and $R^C$ may be bound to each other to form a ring; and $R^D$, $R^E$, and $R^G$ each independently represent single bond, or a bivalent alkylene, alkenylene, cycloalkylene, or bridged cyclic hydrocarbon (bridged hydrocarbon) group each of which may have at least one of ether group, ester group, amido group, urethane group, and ureido group, or a group containing two or more of these groups bound to each other, and wherein the groups in the parentheses in a number of (k–1) may be the same as or different from each other, ring $Z^1$ represents a substituted or unsubstituted alicyclic hydrocarbon ring having 5 to 20 carbon atoms;

$R^a$ represents hydrogen atom, a halogen atom, or an alkyl or haloalkyl group having 1 to 14 carbon atoms;

$E^1$ represents a bivalent hydrocarbon group having 1 to 12 carbon atoms;

"$s^1$" denotes an integer of 0 to 3; $R^{14}$, $R^{15}$, and $R^{16}$ are the same as or different from one another and each represent a substituted or unsubstituted alkyl group having 1 to 6 carbon atoms; $R^{17}$s are substituents bound to Ring $Z^1$, are the same as or different from each other, and each represent oxo group, an alkyl group, a protected or unprotected hydroxyl group, a protected or unprotected hydroxyalkyl group, or a protected or unprotected carboxyl group;

"r" is the number of $R^{17}$s and denotes an integer of 1 to 3, wherein at least one of $rR^{17}$s is a —$COOR^i$ group, wherein $R^i$ represents a substituted or unsubstituted tertiary hydrocarbon, tetrahydrofuranyl, tetrahydropyranyl, or oxepanyl group;

$R^{18}$ and $R^{19}$ are the same as or different from each other and each represent hydrogen atom or a substituted or unsubstituted alkyl group having 1 to 6 carbon atoms;

$R^{20}$ represents hydrogen atom or an organic group, wherein at least two of $R^{18}$, $R^{19}$, and $R^{20}$ may be bound to each other to form a ring with an adjacent atom or atoms, wherein the alicyclic hydrocarbon ring having 5 to 20 carbon atoms as Ring $Z^1$ in Formulae (IVa), (IVb), and (IVc) may be a monocyclic ring or a polycyclic ring such as a fused ring or bridged ring;

$R^{21}$ represents t-butyl group, 2-tetrahydrofuranyl group, 2-tetrahydropyranyl group, or 2-oxepanyl group; and "s" denotes 0 or 1.

2. The polymer for lithographic purposes according to claim 1, further comprising at least one of repeating structural units each having a lactone skeleton and represented by following General Formulae (Va), (Vb), (Vc) (Vd), (Ve), (Vf), (Vg), and (Vh):

[Chem. 5]

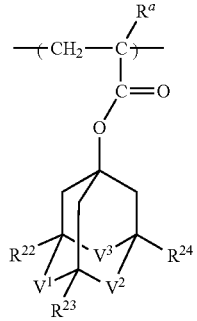

(Va)

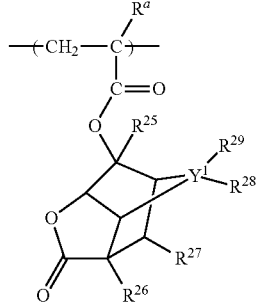

(Vb)

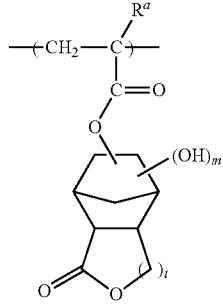

(Vc)

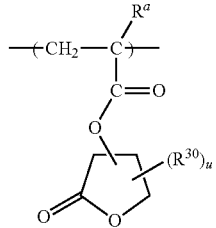

(Vd)

-continued

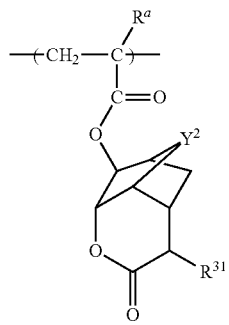

(Ve)

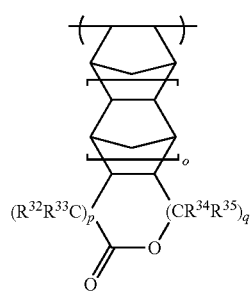

(Vf)

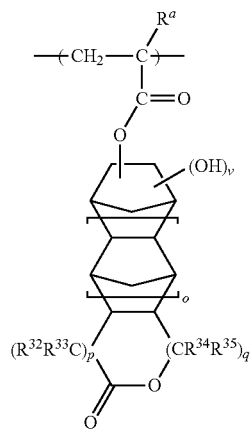

(Vg)

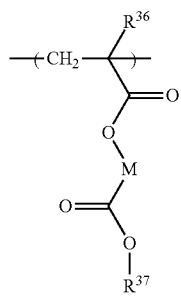

(Vh)

wherein R$^a$ represents hydrogen atom, a halogen atom, or an alkyl or haloalkyl group having 1 to 6 carbon atoms; R$^{22}$, R$^{23}$, and R$^{24}$ are the same as or different from one another and each represent hydrogen atom, an alkyl group, a protected or unprotected hydroxyl group, a protected or unprotected hydroxyalkyl group, or a protected or unprotected carboxyl group; V$^1$, V$^2$, and V$^3$ are the same as or different from one another and each represent —CH$_2$—, —CO—, or —COO—, wherein at least one of V$^1$, V$^2$, and V$^3$ is —COO—; Y$^1$ represents carbon atom, oxygen atom, or sulfur atom, wherein R$^{28}$ and R$^{29}$ are present only when Y$^1$ is carbon atom; R$^{25}$, R$^{26}$, R$^{27}$, R$^{28}$, R$^{29}$, and R$^{30}$ are the same as or different from one another and each represent hydrogen atom, an alkyl group, a protected or unprotected hydroxyl group, a protected or unprotected hydroxyalkyl group, a protected or unprotected carboxyl group, cyano group, a halogen atom, or a fluoroalkyl group having 1 to 6 carbon atoms; "t" denotes an integer of 1 or 2; "u" denotes an integer of 0 or 1; Y$^2$ represents oxygen atom, sulfur atom, or methylene group; R$^{31}$ represents hydrogen atom or an alkyl group having 1 to 6 carbon atoms; R$^{32}$, R$^{33}$, R$^{34}$, and R$^{35}$ are the same as or different from one another and each represent hydrogen atom or methyl group; "o", "p", "q", and "v" each independently denote 0 or 1; R$^{36}$ represents hydrogen atom, a halogen atom, or a substituted or unsubstituted alkyl group having 1 to 6 carbon atoms; R$^{37}$ represents a group having a lactone skeleton; and M represents a bivalent organic group having 1 to 6 carbon atoms.

3. The polymer for lithographic purposes according to claim 1, wherein the polymer contains aromatic cyclic groups in an amount of 1.5 mmol/g or less based on the total weight of the polymer.

4. The polymer for lithographic purposes according to claim 1, wherein the polymer contains a substituted or unsubstituted naphthalene ring as an aromatic ring of X in General Formula (I) or of X in General Formula (III).

5. A composition for lithographic purposes, comprising the polymer for lithographic purposes according to claim 1; and a compound capable of generating an acid upon irradiation with an actinic ray or radiation.

6. A method for manufacturing a semiconductor device, the method comprising the steps of applying the composition for lithographic purposes as defined in claim 5 to a base or substrate to form a resist film; and exposing, developing, and thereby patterning the resist film.

7. The method for manufacturing a semiconductor device, according to claim 6, wherein the exposing is performed using a far-ultraviolet ray having a wavelength of 220 nm or less as an exposing source.

8. A polymer for lithographic purposes, as a product from a reaction between a polymeric compound and another compound in the presence of a catalyst, the polymeric compound comprising:
at least one repeating structural unit represented by General Formula (II):

(II)

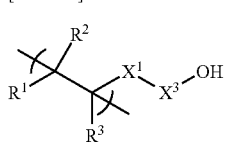

wherein
R$^1$ and R$^3$ each independently represent hydrogen atom, a halogen atom, cyano group, an alkyl group, or a haloalkyl group; R$^2$ represents hydrogen atom, cyano group, —CO—OR$^A$, or —CO—N(R$^B$)(R$^C$);
X$^1$ represents single bond, or a substituted or unsubstituted bivalent alkylene, alkenylene, or cycloalkylene group, or —O—, —SO$_2$—, —O—CO—R$^D$—, —CO—O—R$^E$, or —CO—N(R$^F$)—R$^G$—;
X$^3$ represents single bond or —CO—;

$R^A$ represents hydrogen atom or an alkyl group, a cycloalkyl group, an alkenyl group, or a group decomposable by the action of an acid;

$R^B$, $R^C$, and $R^F$ each independently represent hydrogen atom, an alkyl group, a cycloalkyl group, or an alkenyl group, wherein $R^B$ and $R^C$ may be bound to each other to form a ring; and $R^D$, $R^E$, and $R^G$ each independently represent single bond, or a bivalent alkylene, alkenylene, cycloalkylene, or bridged cyclic hydrocarbon (bridged hydrocarbon) group each of which may have at least one of ether group, ester group, amido group, urethane group, and ureido group, or a group containing two or more of these groups bound to each other, and wherein the other compound is represented by General Formula (III):

[Chem. 3]

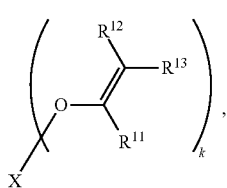
(III)

wherein
$R^{11}$ represents hydrogen atom or an alkyl group having 1 to 16 carbon atoms;

$R^{12}$ and $R^{13}$ are the same as or different from each other and each represent hydrogen atom, an alkyl group, or a cycloalkyl group, wherein $R^{12}$ and $R^{13}$ may be bound to each other to form a ring with the adjacent carbon atom;

X represents a substituted or unsubstituted group having a valency of "k" and including at least one aromatic cyclic group and at least one nonaromatic group; and "k" denotes an integer of 2 or more, wherein the groups in the parentheses in a number of "k" may be the same as or different from each other, and wherein the polymer further comprises at least one repeating structural unit, each having a group capable of leaving with an acid to allow the residual moiety to be soluble in an alkali, wherein the repeating structural units are represented by General Formulae (IVa), (IVb), (IVc), (IVd), and (IVe):

[Chem. 4]

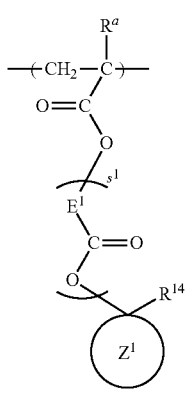
(IVa)

-continued

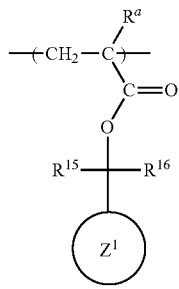
(IVb)

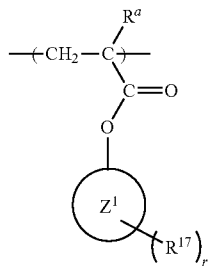
(IVc)

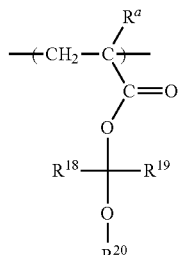
(IVd)

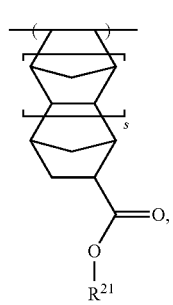
(IVe)

wherein
ring $Z^1$ represents a substituted or unsubstituted alicyclic hydrocarbon ring having 5 to 20 carbon atoms;

$R^a$ represents hydrogen atom, a halogen atom, or an alkyl or haloalkyl group having 1 to 14 carbon atoms;

$E^1$ represents a bivalent hydrocarbon group having 1 to 12 carbon atoms;

"$s^1$" denotes an integer of 0 to 3;

$R^{14}$, $R^{15}$, and $R^{16}$ are the same as or different from one another and each represent a substituted or unsubstituted alkyl group having 1 to 6 carbon atoms;

$R^{17}$s are substituents bound to Ring $Z^1$, are the same as or different from each other, and each represent oxo group, an alkyl group, a protected or unprotected hydroxyl group, a protected or unprotected hydroxyalkyl group, or a protected or unprotected carboxyl group;

"r" is the number of $R^{17}$s and denotes an integer of 1 to 3, wherein at least one of $rR^{17}$ s is a —$COOR^i$ group, wherein $R^i$ represents a substituted or unsubstituted tertiary hydrocarbon, tetrahydrofuranyl, tetrahydropyranyl, or oxepanyl group;

$R^{18}$ and $R^{19}$ are the same as or different from each other and each represent hydrogen atom or a substituted or unsubstituted alkyl group having 1 to 6 carbon atoms;

$R^{20}$ represents hydrogen atom or an organic group, wherein at least two of $R^{18}$, $R^{19}$, and $R^{20}$ may be bound to each other to form a ring with an adjacent atom or atoms, wherein the alicyclic hydrocarbon ring having 5 to 20 carbon atoms as Ring $Z^1$ in Formulae (IVa), (IVb), and (IVc) may be a monocyclic ring or a polycyclic ring such as a fused ring or bridged ring;

$R^{21}$ represents t-butyl group, 2-tetrahydrofuranyl group, 2-tetrahydropyranyl group, or 2-oxepanyl group; and "s" denotes 0 or 1.

9. The polymer for lithographic purposes according to claim 8, wherein the polymeric compound having at least one repeating structural unit represented by General Formula (II) has a weight-average molecular weight of 7000 or less, and the polymer has a weight-average molecular weight of 4500 or more, where the polymer is derived from the polymeric compound having at least one repeating structural unit represented by General Formula (II) and the compound represented by General Formula (III) through a reaction therebetween.

10. A method for producing a polymer for lithographic purposes, the method comprising the step of reacting, in the presence of a catalyst, a polymeric compound having at least one repeating structural unit represented by General Formula (II) with a compound represented by General Formula (III):

[Chem. 6]

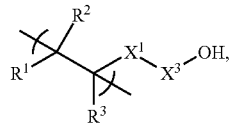

(II)

wherein $R^1$ and $R^3$ each independently represent hydrogen atom, a halogen atom, cyano group, an alkyl group, or a haloalkyl group;

$R^2$ represents hydrogen atom, cyano group, —CO—OR$^A$, or —CO—N(R$^E$)(R$^C$);

$X^1$ represents single bond, or a substituted or unsubstituted bivalent alkylene, alkenylene, or cycloalkylene group, or —O—, —SO$_2$—, —O—CO—R$^D$—, —CO—O—R$^E$, or —CO—N(R$^F$)—R$^G$—;

$X^3$ represents single bond or —CO—; R$^A$ represents hydrogen atom or an alkyl group, a cycloalkyl group, an alkenyl group, or a group decomposable by the action of an acid;

R$^B$, R$^C$, and R$^F$ each independently represent hydrogen atom, an alkyl group, a cycloalkyl group, or an alkenyl group, wherein R$^B$ and R$^C$ may be bound to each other to form a ring; and R$^D$, R$^E$, and R$^G$ each independently represent single bond, or a bivalent alkylene, alkenylene, cycloalkylene, or bridged cyclic hydrocarbon (bridged hydrocarbon) group, each of which may have at least one of ether group, ester group, amido group, urethane group, and ureido group, or a group containing two or more of these groups bound to each other,

[Chem. 7]

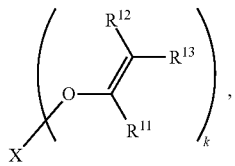

(III)

wherein $R^{11}$ represents hydrogen atom or an alkyl group having 1 to 16 carbon atoms;

$R^{12}$ and $R^{13}$ are the same as or different from each other and each represent hydrogen atom, an alkyl group, or a cycloalkyl group, wherein $R^{12}$ and $R^{13}$ may be bound to each other to form a ring with the adjacent carbon atom; X represents a substituted or unsubstituted group having a valency of "k" and including at least one aromatic cyclic group and at least one nonaromatic group; and "k" denotes an integer of 2 or more, wherein the groups in the parentheses in a number of "k" may be the same as or different from each other, and wherein the polymeric compound further comprises at least one repeating structural unit, each having a group capable of leaving with an acid to allow the residual moiety to be soluble in an alkali, wherein the repeating structural units are represented by General Formulae (IVa), (IVb), (IVc), (IVd), and (IVe):

[Chem. 4]

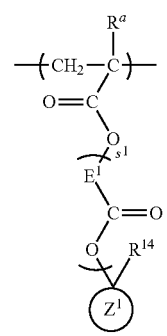

(IVa)

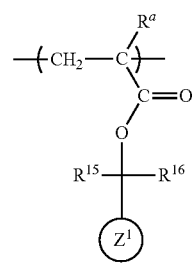

(IVb)

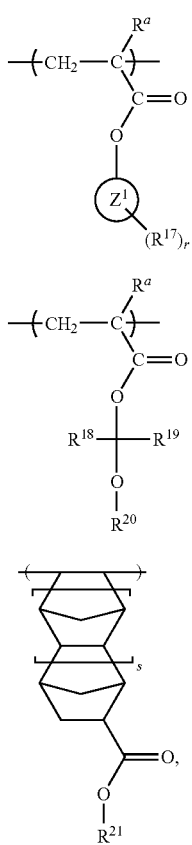

wherein
ring $Z^1$ represents a substituted or unsubstituted alicyclic hydrocarbon ring having 5 to 20 carbon atoms;
$R^a$ represents hydrogen atom, a halogen atom, or an alkyl or haloalkyl group having 1 to 14 carbon atoms; $E^1$ represents a bivalent hydrocarbon group having 1 to 12 carbon atoms;
"$s^1$" denotes an integer of 0 to 3;
$R^{14}$, $R^{15}$, and $R^{16}$ are the same as or different from one another and each represent a substituted or unsubstituted alkyl group having 1 to 6 carbon atoms;
$R^{17}$s are substituents bound to Ring $Z^1$, are the same as or different from each other, and each represent oxo group, an alkyl group, a protected or unprotected hydroxyl group, a protected or unprotected hydroxyalkyl group, or a protected or unprotected carboxyl group;
"r" is the number of $R^{17}$s and denotes an integer of 1 to 3, wherein at least one of r$R^{17}$s is a —COOR$^1$ group, wherein $R^1$ represents a substituted or unsubstituted tertiary hydrocarbon, tetrahydrofuranyl, tetrahydropyranyl, or oxepanyl group;
$R^{18}$ and $R^{19}$ are the same as or different from each other and each represent hydrogen atom or a substituted or unsubstituted alkyl group having 1 to 6 carbon atoms;
$R^{20}$ represents hydrogen atom or an organic group, wherein at least two of $R^{18}$, $R^{19}$, and $R^{20}$ may be bound to each other to form a ring with an adjacent atom or atoms, wherein the alicyclic hydrocarbon ring having 5 to 20 carbon atoms as Ring $Z^1$ in Formulae (IVa), (IVb), and (IVc) may be a monocyclic ring or a polycyclic ring such as a fused ring or bridged ring;
$R^{21}$ represents t-butyl group, 2-tetrahydrofuranyl group, 2-tetrahydropyranyl group, or 2-oxepanyl group; and
"s" denotes 0 or 1.

\* \* \* \* \*